US011888043B2

(12) United States Patent
Tan

(10) Patent No.: US 11,888,043 B2
(45) Date of Patent: Jan. 30, 2024

(54) CONTACT OVER ACTIVE GATE STRUCTURES WITH CONDUCTIVE GATE TAPS FOR ADVANCED INTEGRATED CIRCUIT STRUCTURE FABRICATION

(71) Applicant: Intel Corporation, Santa Clara, CA (US)

(72) Inventor: Elliot Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/093,443

(22) Filed: Jan. 5, 2023

(65) Prior Publication Data
US 2023/0154995 A1 May 18, 2023

Related U.S. Application Data

(63) Continuation of application No. 16/238,428, filed on Jan. 2, 2019, now Pat. No. 11,581,412.

(51) Int. Cl.
*H01L 29/423* (2006.01)
*H01L 29/40* (2006.01)
*H01L 21/8234* (2006.01)
*H01L 27/088* (2006.01)
*H01L 29/78* (2006.01)

(52) U.S. Cl.
CPC .......... *H01L 29/42376* (2013.01); *H01L 21/823437* (2013.01); *H01L 27/0886* (2013.01); *H01L 29/401* (2013.01); *H01L 29/7856* (2013.01)

(58) Field of Classification Search
CPC ............ H01L 29/42376; H01L 29/401; H01L 29/7856; H01L 21/823437; H01L 27/0886
USPC ......................................................... 257/401
See application file for complete search history.

(56) References Cited

U.S. PATENT DOCUMENTS

2019/0165145 A1* 5/2019 Ghani ............ H01L 21/823878

* cited by examiner

*Primary Examiner* — Calvin Y Choi
(74) *Attorney, Agent, or Firm* — Schwabe, Williamson & Wyatt, P.C.

(57) ABSTRACT

Contact over active gate (COAG) structures with conductive gate taps are described. In an example, an integrated circuit structure includes a plurality of gate structures above a substrate, each of the gate structures including a gate insulating layer thereon. Each of the plurality of gate structures includes a conductive tap structure protruding through the corresponding gate insulating layer. A plurality of conductive trench contact structures is alternating with the plurality of gate structures, each of the conductive trench contact structures including a trench insulating layer thereon. An interlayer dielectric material is above the trench insulating layers and the gate insulating layers. An opening is in the interlayer dielectric material and exposes the conductive tap structure of one of the plurality of gate structures. A conductive structure is in the opening and is in direct contact with the conductive tap structure of one of the plurality of gate structures.

20 Claims, 18 Drawing Sheets

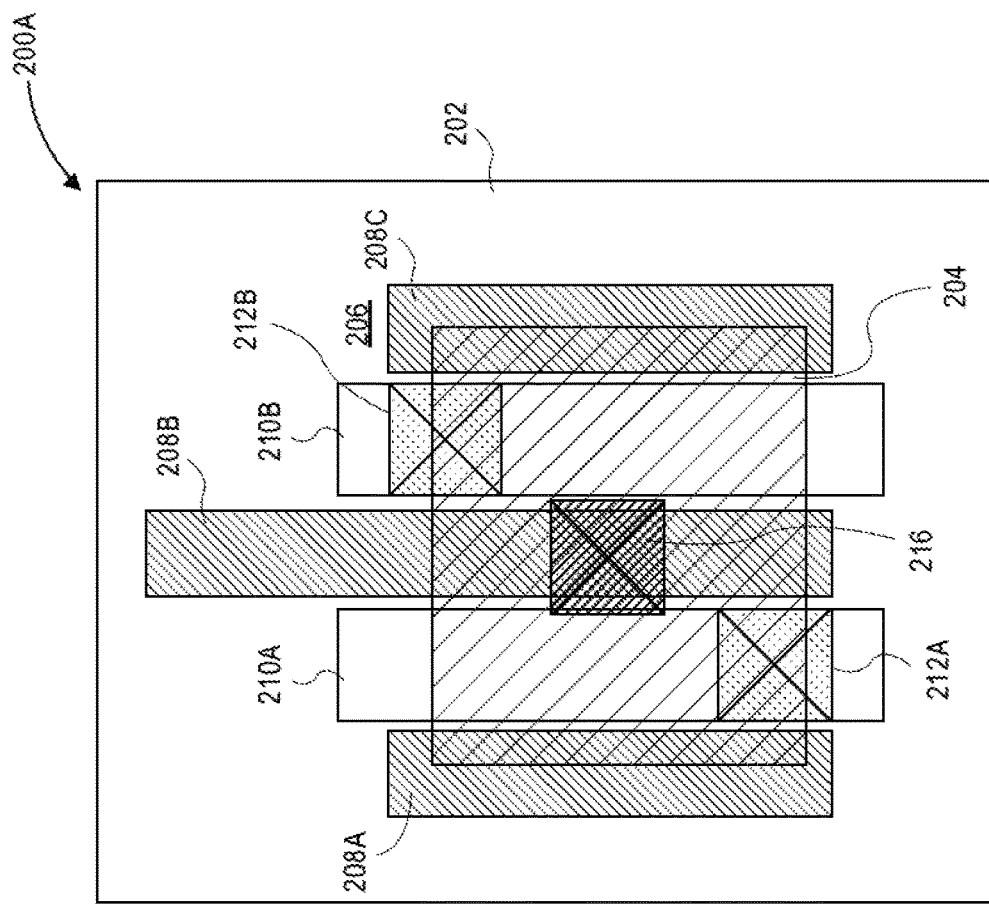
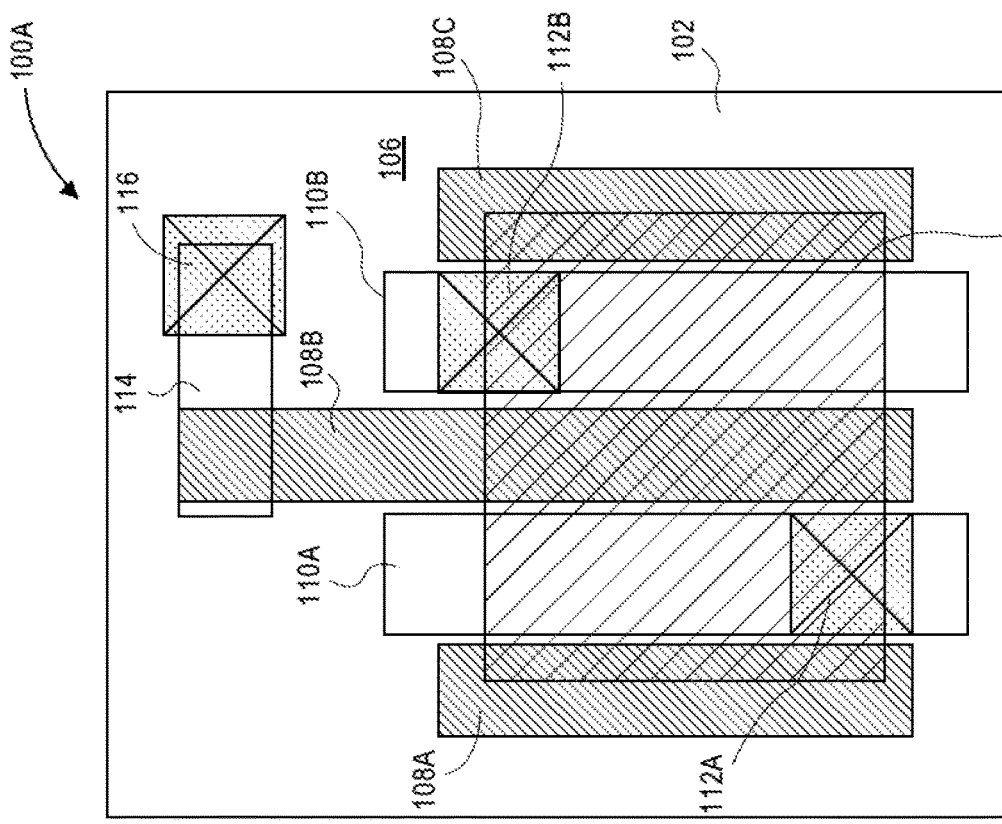

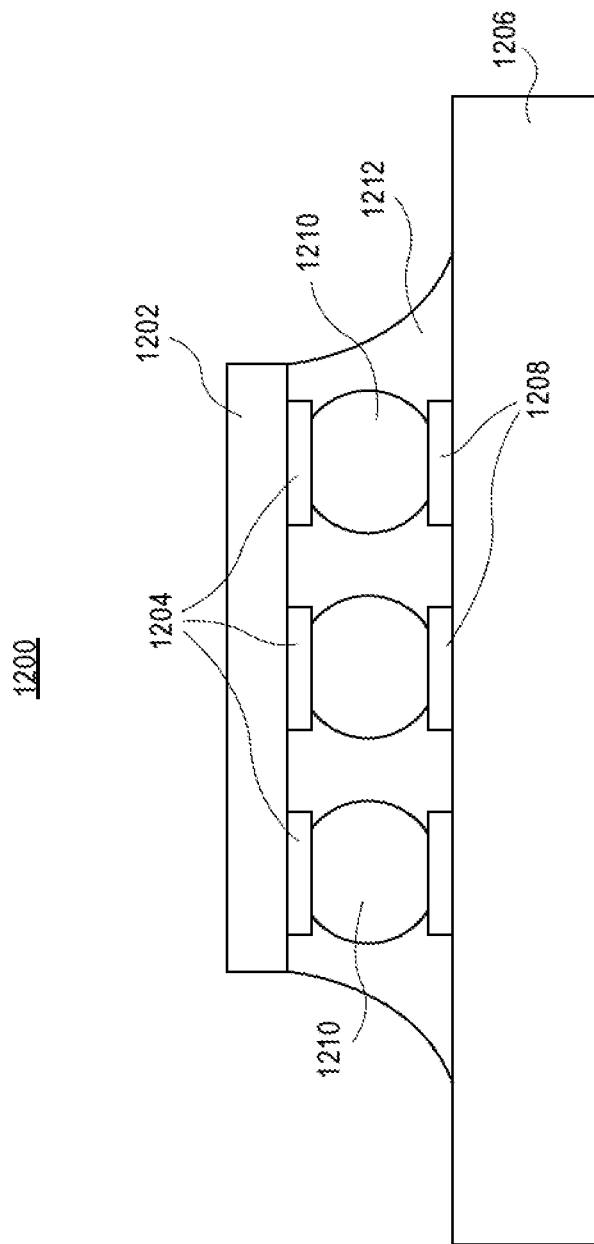

US 11,888,043 B2

CONTACT OVER ACTIVE GATE STRUCTURES WITH CONDUCTIVE GATE TAPS FOR ADVANCED INTEGRATED CIRCUIT STRUCTURE FABRICATION

CROSS-REFERENCE TO RELATED APPLICATIONS

This application is a continuation of U.S. patent application Ser. No. 16/238,428, filed on Jan. 2, 2019, the entire contents of which is hereby incorporated by reference herein.

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 1A illustrates a plan view of a semiconductor device having a gate contact disposed over an inactive portion of a gate electrode.

FIG. 2A illustrates a plan view of a semiconductor device having a gate contact via disposed over an active portion of a gate electrode, in accordance with an embodiment of the present disclosure.

FIG. 12 illustrates a cross-sectional view of a flip-chip mounted die, in accordance with an embodiment of the present disclosure.

DESCRIPTION OF THE EMBODIMENTS

Figures 1B, 2B:
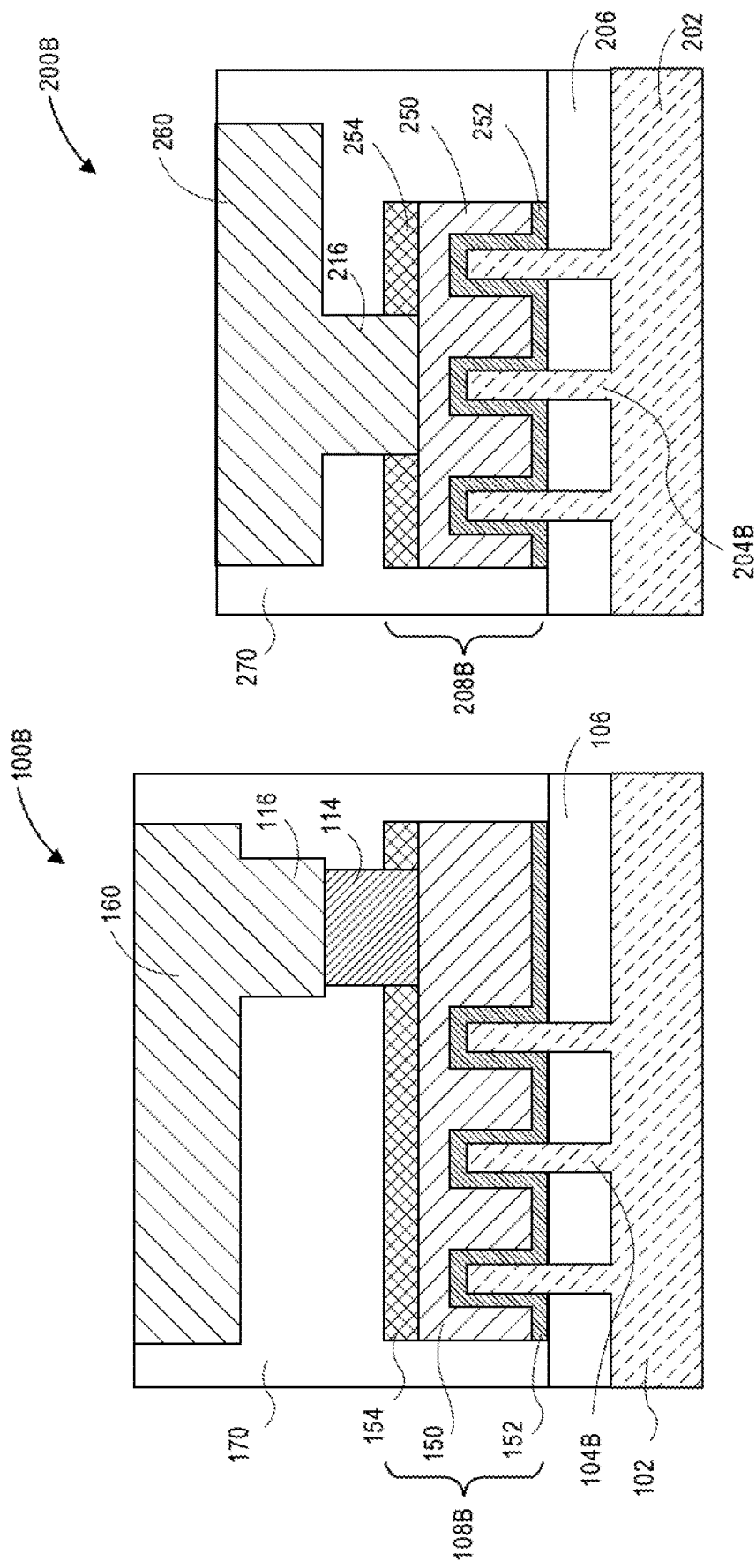
FIG. 1B illustrates a cross-sectional view of a non-planar semiconductor device having a gate contact disposed over an inactive portion of a gate electrode.
FIG. 2B illustrates a cross-sectional view of a non-planar semiconductor device having a gate contact via disposed over an active portion of a gate electrode, in accordance with an embodiment of the present disclosure.

Contact over active gate (COAG) structures with conductive gate taps, and methods of fabricating contact over active gate (COAG) structures with conductive gate taps, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

To provide context, some implementations of Contact-Over-Active-Gate requires a selective ("color") etch. An associated process window for the etch may be insufficient. For example, defect modes of opens and shorts may persistently degrade the manufacturing yield. The open circuit defect may also attributed to damascene metallization that is not able to fill into deep and tight spaces.

To provide further context, some implementations of COAG impose tight controls on multiple modules such as gate and contact recess, dielectric hard masks deposition, and dielectric polish to ensure uniformity of the etch selective ("colored") hardmasks and strict adherence of the hardmask thickness to specifications. Limited etch selectivity of the color etches may leave little room for any upstream process deviations typical of a manufacturing line. The COAG implementations may not provide a robust process window that eliminates all opens and shorts.

In accordance with one or more embodiments of the present disclosure, COAG approaches described herein may be implemented to eliminate one of the color etches by creating conductive gate taps during gate recess and allowing such conductive gate tap structures to rise above the recessed gate and make connection with the metal layer above. Embodiments may be implemented to also eliminate the need for metal gap fill into deep and tight spaces. Embodiments may be implemented to advantageously achieve a high yielding manufacturing process.

To provide further context, in technologies where space and layout constraints are somewhat relaxed compared with current generation space and layout constraints, a contact to gate structure may be fabricated by making contact to a portion of the gate electrode disposed over an isolation region. As an example, FIG. 1A illustrates a plan view of a semiconductor device having a gate contact disposed over an inactive portion of a gate electrode.

Referring to FIG. 1A, a semiconductor structure or device 100A includes a diffusion or active region 104 disposed in a substrate 102, and within an isolation region 106. One or more gate lines (also known as poly lines), such as gate lines 108A, 108B and 108C are disposed over the diffusion or active region 104 as well as over a portion of the isolation region 106. Source or drain contacts (also known as trench contacts), such as contacts 110A and 110B, are disposed over source and drain regions of the semiconductor structure or device 100A. Trench contact vias 112A and 112B provide contact to trench contacts 110A and 110B, respectively. A separate gate contact 114, and overlying gate contact via 116, provides contact to gate line 108B. In contrast to the source or drain trench contacts 110A or 110B, the gate contact 114 is disposed, from a plan view perspective, over isolation region 106, but not over diffusion or active region 104. Furthermore, neither the gate contact 114 nor gate contact via 116 is disposed between the source or drain trench contacts 110A and 110B.

FIG. 1B illustrates a cross-sectional view of a non-planar semiconductor device having a gate contact disposed over an inactive portion of a gate electrode. Referring to FIG. 1B, a semiconductor structure or device 100B, e.g. a non-planar version of device 100A of FIG. 1A, includes a non-planar diffusion or active region 104B (e.g., a fin structure) formed from substrate 102, and within isolation region 106. Gate line 108B is disposed over the non-planar diffusion or active region 104B as well as over a portion of the isolation region 106. As shown, gate line 108B includes a gate electrode 150 and gate dielectric layer 152, along with a dielectric cap layer 154. Gate contact 114, and overlying gate contact via 116 are also seen from this perspective, along with an overlying metal interconnect 160, all of which are disposed in inter-layer dielectric stacks or layers 170. Also seen from the perspective of FIG. 1B, the gate contact 114 is disposed over isolation region 106, but not over non-planar diffusion or active region 104B.

Referring again to FIGS. 1A and 1B, the arrangement of semiconductor structure or device 100A and 100B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 2A illustrates a plan view of a semiconductor device having a gate contact via disposed over an active portion of a gate electrode, in accordance with an embodiment of the present disclosure. Referring to FIG. 2A, a semiconductor structure or device 200A includes a diffusion or active region 204 disposed in a substrate 202, and within an isolation region 206. One or more gate lines, such as gate lines 208A, 208B and 208C are disposed over the diffusion or active region 204 as well as over a portion of the isolation region 206. Source or drain trench contacts, such as trench contacts 210A and 210B, are disposed over source and drain regions of the semiconductor structure or device 200A. Trench contact vias 212A and 212B provide contact to trench contacts 210A and 210B, respectively. A gate contact via 216, with no intervening separate gate contact layer, provides contact to gate line 208B. In contrast to FIG. 1A, the gate contact 216 is disposed, from a plan view perspective, over the diffusion or active region 204 and between the source or drain contacts 210A and 210B.

FIG. 2B illustrates a cross-sectional view of a non-planar semiconductor device having a gate contact via disposed over an active portion of a gate electrode, in accordance with an embodiment of the present disclosure. Referring to FIG. 2B, a semiconductor structure or device 200B, e.g. a non-planar version of device 200A of FIG. 2A, includes a non-planar diffusion or active region 204B (e.g., a fin structure) formed from substrate 202, and within isolation region 206. Gate line 208B is disposed over the non-planar diffusion or active region 204B as well as over a portion of the isolation region 206. As shown, gate line 208B includes a gate electrode 250 and gate dielectric layer 252, along with a dielectric cap layer 254. The gate contact via 216 is also seen from this perspective, along with an overlying metal interconnect 260, both of which are disposed in inter-layer dielectric stacks or layers 270. Also seen from the perspective of FIG. 2B, the gate contact via 216 is disposed over non-planar diffusion or active region 204B.

Thus, referring again to FIGS. 2A and 2B, in an embodiment, trench contact vias 212A, 212B and gate contact via 216 are formed in a same layer and are essentially co-planar. In comparison to FIGS. 1A and 1B, the contact to the gate line would otherwise include and additional gate contact layer, e.g., which could be run perpendicular to the corresponding gate line. In the structure(s) described in association with FIGS. 2A and 2B, however, the fabrication of structures 200A and 200B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208A and 208B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 208A and 208B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., trench insulating layer (TILA)). The additional dielectric material is included as a trench contact dielectric cap layer with etch characteristics different from the gate dielectric material cap layer used for trench contact alignment in a gate aligned contact process (GAP) processing scheme (e.g., use of a gate insulating layer (GILA)).

In accordance with one or more embodiments of the present disclosure, a patterning operation is inserted prior to gate recess to enable fabrication of an elevated conductive tap structure to connect with ultimately fabricated overlying metal layers. In one embodiment, a subsequent via etch performed in an overlying metallization layer no longer needs to include a GILA etch, and the metallization only has to fill into the inter-layer dielectric and not deep into a recessed gate. In an embodiment, in order to prevent gate etch out from occurring in the TCN section of the flow, the conductive taps may be recessed and covered with a thin dielectric layer. The protective cover may subsequently be removed during TILA polish prior to initiating BEOL processing.

As an exemplary processing scheme, FIGS. 3A-3D illustrate cross-sectional views illustrating various operations in a method of fabricating a contact over active gate (COAG) structure having a conductive gate tap, in accordance with an embodiment of the present disclosure.

Figure 3B:
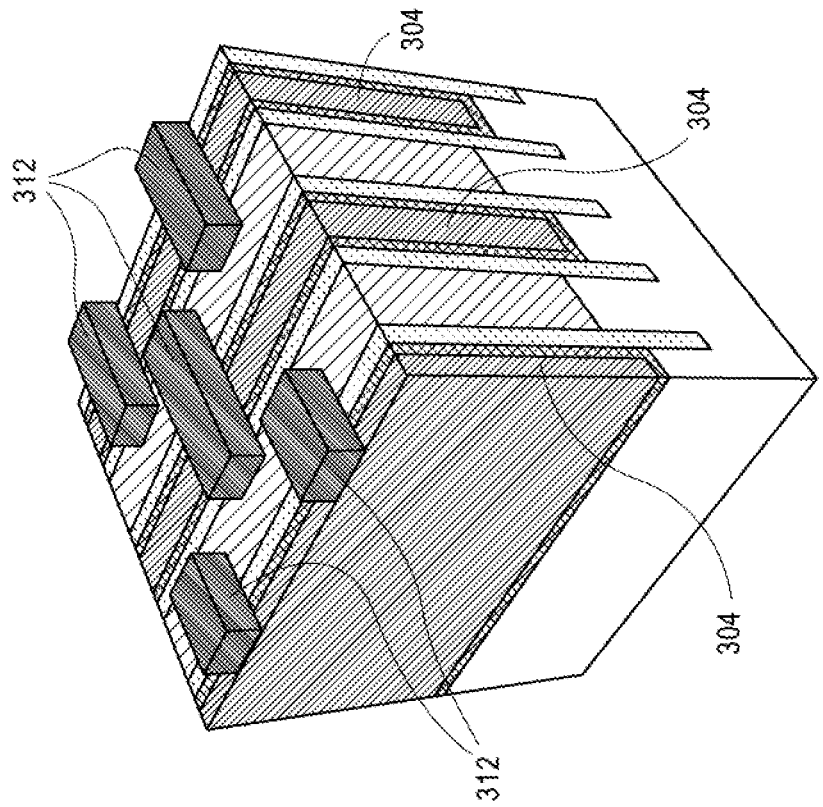
FIGS. 3A-3D illustrate cross-sectional views illustrating various operations in a method of fabricating a contact over active gate (COAG) structure having a conductive gate tap, in accordance with an embodiment of the present disclosure.
Figure 3A:
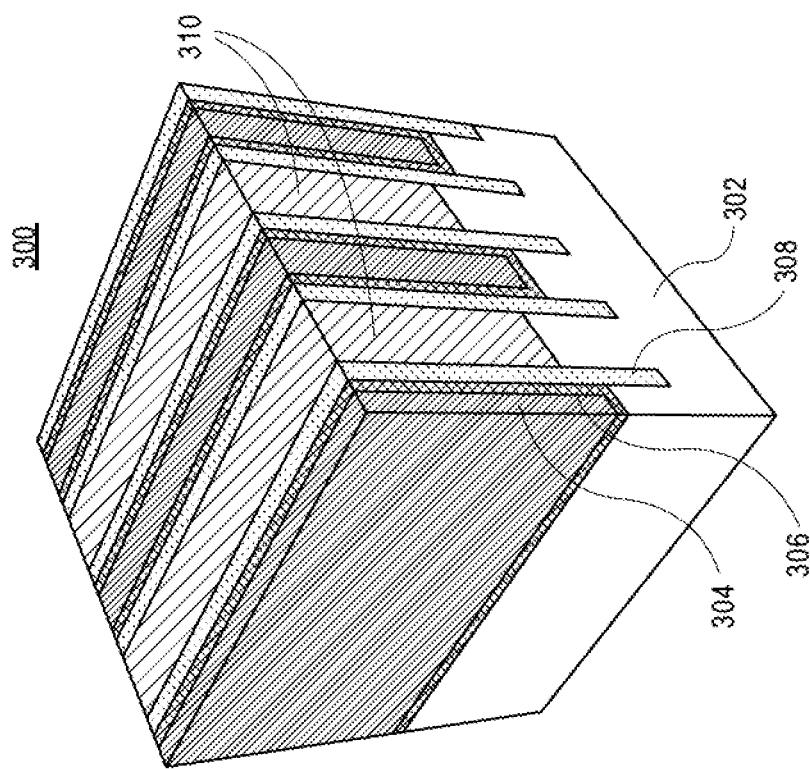

Referring to FIG. 3A, a starting structure 300 includes a plurality of gate structures 304/306 above a substrate 302. The gate structures each include a gate electrode 304 and a gate dielectric 306. Dielectric spacers 308 are formed along sidewalls of the gate structures 304/306. Trench contact locations 310 are between the dielectric spacers 308 of adjacent gate structures 304/306. In one embodiment, trench contact locations 310 include a dielectric material in structure 300 at the point in processing of starting structure 300, where the dielectric material is later removed and then replaced with conductive trench contact material. In another embodiment, the trench contact locations 310 include a conductive material at the point in processing of starting structure 300.

Referring to FIG. 3B, a mask 312 is formed over the starting structure 300. The mask 312 covers one or more portions of the plurality of gate structures 304/306.

Figure 3D:
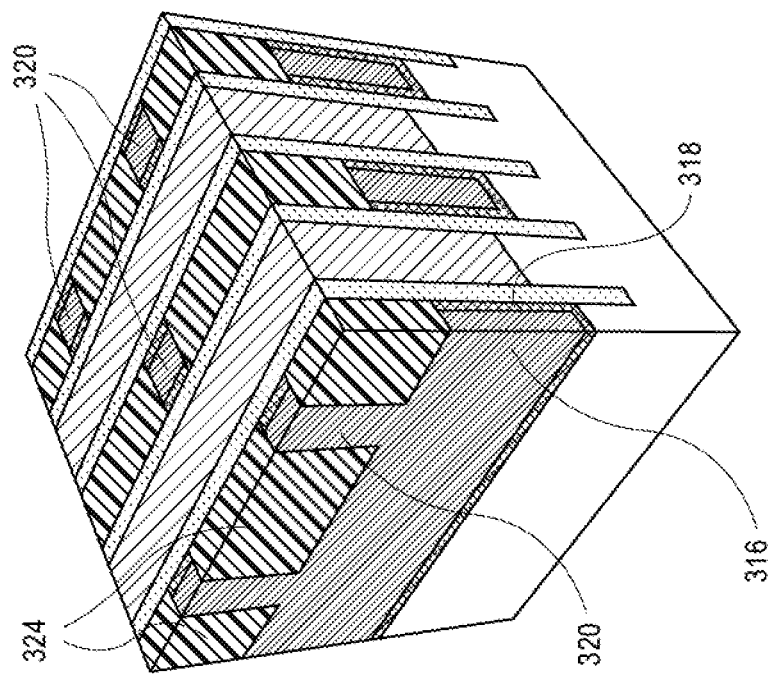
Figure 3C:
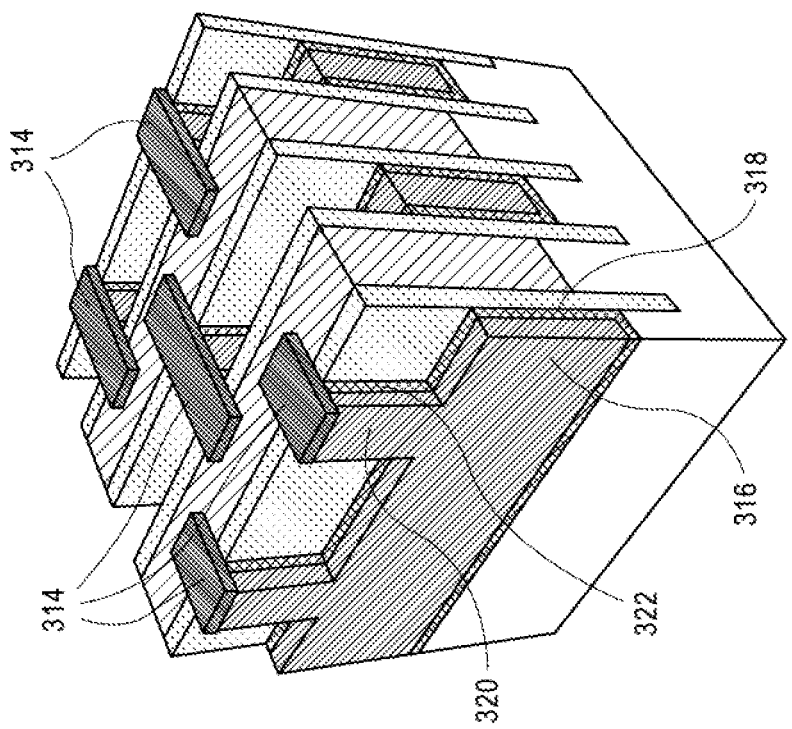

Referring to FIG. 3C, upper portions of the plurality of gate structures 304/306 exposed by mask 312 are then recessed to form recessed gate electrode portions 316 and recessed gate dielectric portions 318. However, upper portions of the plurality of gate structures 304/306 covered by mask 312 are protected from recessing to form gate tap structure gate electrode portions 320 and gate tap structure gate dielectric portions 322.

Referring to FIG. 3D, a gate insulating cap layer 324 is formed on the recessed gate electrode portions 316 and recessed gate dielectric portions 318. In an embodiment, the gate insulating cap layer 324 is formed by blanket deposition and subsequent planarization which removes the mask 312 in the process. As a result, gate tap structure gate electrode portions 320 and gate tap structure gate dielectric portions 322 are exposed in the structure of FIG. 3D.

In accordance with an embodiment of the present disclosure, further processing of the structure of FIG. 3D includes forming an interlayer dielectric material above the structure of FIG. 3D and then forming an opening in the interlayer dielectric material. The opening exposes a conductive tap structure of one of the plurality of gate structures. A conductive structure is then formed in the opening, the conductive structure in direct contact with the conductive tap structure.

As another exemplary processing scheme, FIGS. 4A-4D illustrate cross-sectional views illustrating various operations in another method of fabricating a contact over active gate (COAG) structure having a conductive gate tap, in accordance with an embodiment of the present disclosure. The processing scheme may be used to effectively protect conductive gate taps during intermediate processing.

Figure 4B:
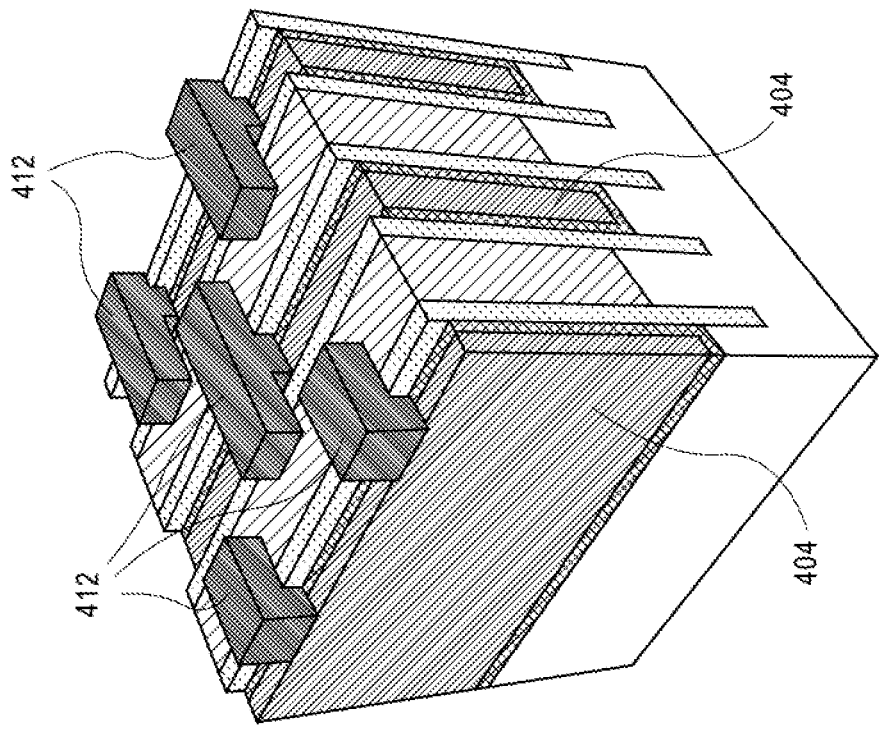
FIGS. 4A-4D illustrate cross-sectional views illustrating various operations in another method of fabricating a contact over active gate (COAG) structure having a conductive gate tap, in accordance with an embodiment of the present disclosure.
Figure 4A:
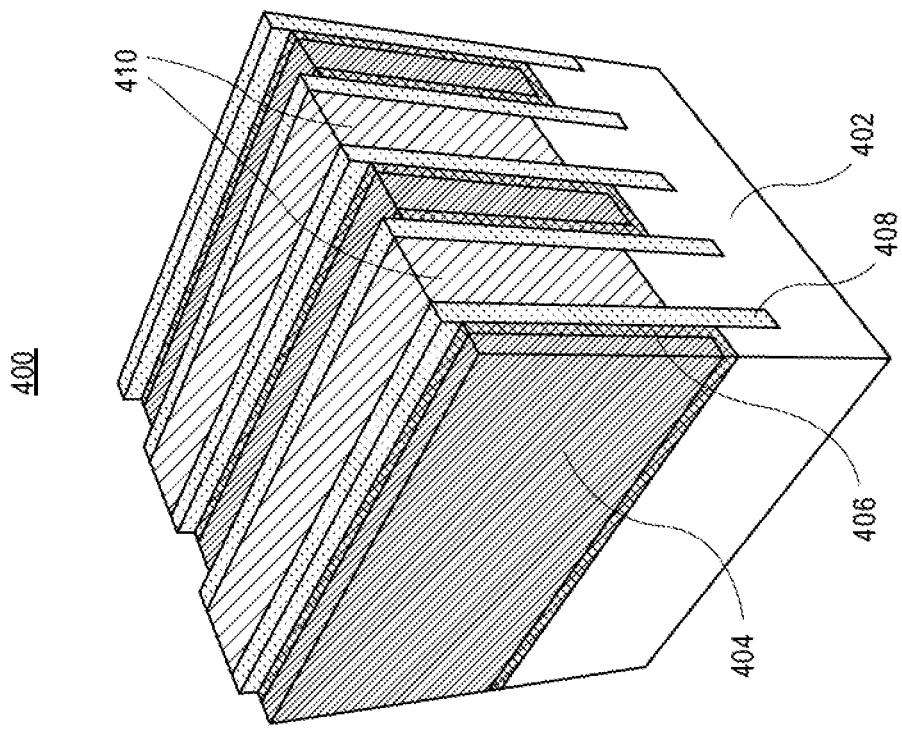

Referring to FIG. 4A, a starting structure 400 includes a plurality of partially recessed gate structures 404/406 above a substrate 402. The partially recessed gate structures each include a partially recessed gate electrode 404 and a partially recessed gate dielectric 406. Dielectric spacers 408 are along sidewalls of the partially recessed gate structures 404/406. The dielectric spacers 408 protrude above the partially recessed gate structures 404/406. Trench contact locations 410 are between the dielectric spacers 408 of adjacent partially recessed gate structures 404/406. In one embodiment, trench contact locations 410 include a dielectric material in structure 400 at the point in processing of starting structure 400, where the dielectric material is later removed and then replaced with conductive trench contact material. In another embodiment, the trench contact locations 410 include a conductive material at the point in processing of starting structure 400.

Referring to FIG. 4B, a mask 412 is formed over the starting structure 400. The mask 412 covers one or more portions of the plurality of partially recessed gate structures 404/406.

Figure 4D:
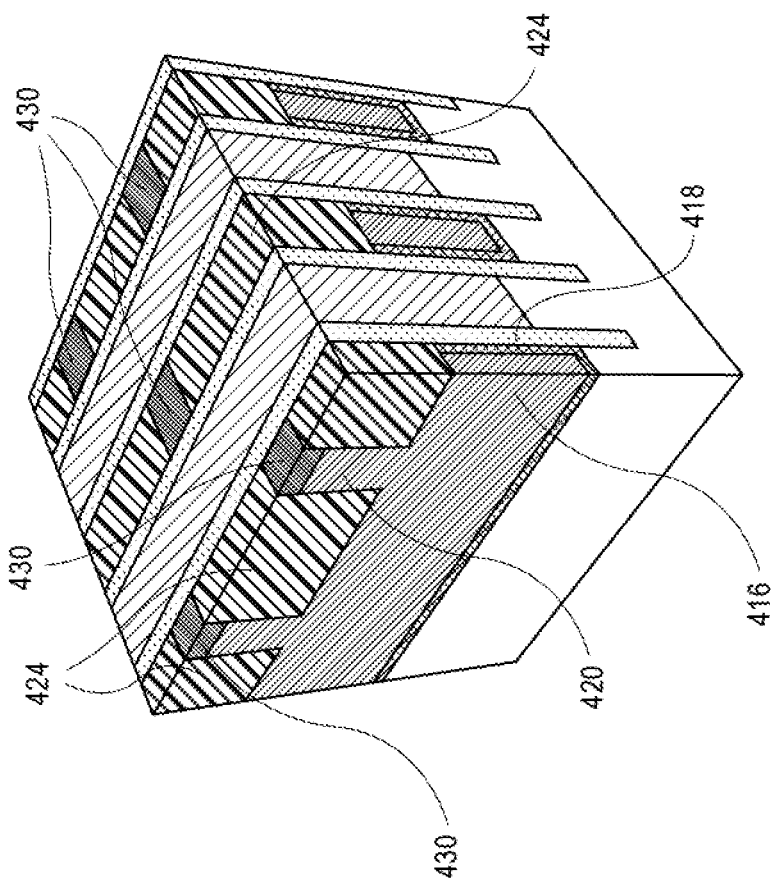
Figure 4C:
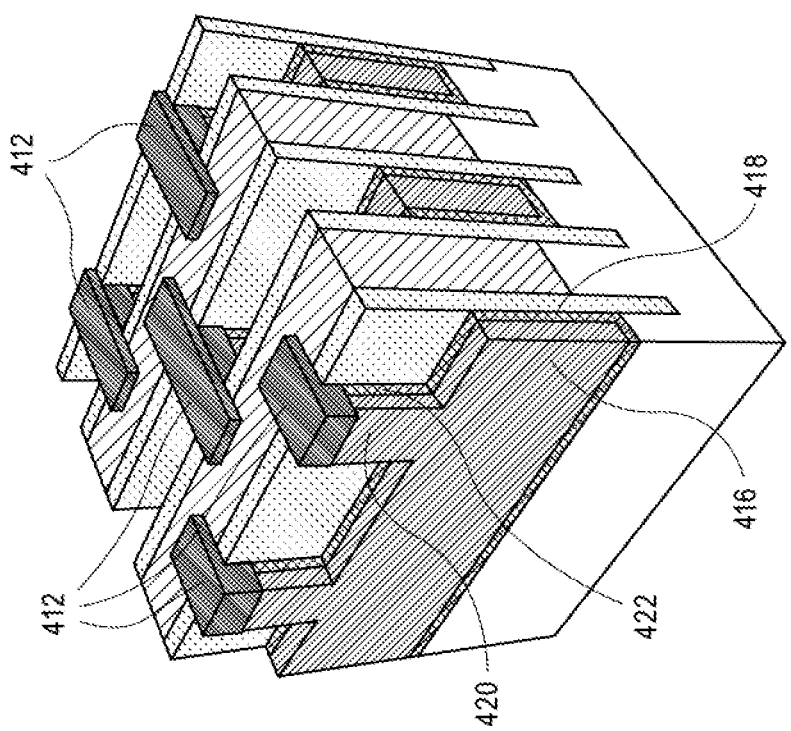

Referring to FIG. 4C, upper portions of the plurality of partially recessed gate structures 404/406 exposed by mask 412 are then further recessed to form further recessed gate electrode portions 416 and further recessed gate dielectric portions 418. However, upper portions of the plurality of partially recessed gate structures 404/406 covered by mask 412 are protected from recessing to form partially recessed gate tap structure gate electrode portions 420 and partially recessed gate tap structure gate dielectric portions 422.

Referring to FIG. 4D, a gate insulating cap layer 424 is formed on the further recessed gate electrode portions 416 and further recessed gate dielectric portions 418. In an embodiment, the gate insulating cap layer 424 is formed by blanket deposition and subsequent planarization which removes a portion of, but not all of, the mask 412 in the process. A mask portion 430 is retained over gate tap structure gate electrode portions 420 and gate tap structure gate dielectric portions 422 as a protection layer.

In accordance with an embodiment of the present disclosure, further processing of the structure of FIG. 4D includes planarizing the structure to remove the mask portion 430 and to expose the gate tap structure gate electrode portions 420 and gate tap structure gate dielectric portions 422. The removal of mask portion 430 may be performed after intermediate processing such as the formation of conductive contact structure at locations 410. Subsequent processing may include forming an interlayer dielectric material and then forming an opening in the interlayer dielectric material. The opening exposes a conductive tap structure of one of the plurality of gate structures. A conductive structure is then formed in the opening, the conductive structure in direct contact with the conductive tap structure.

In accordance with an embodiment of the present disclosure, and as exemplified in structures described below, an integrated circuit structure formed from a process described in association with FIGS. 3A-3D or 4A-4D includes a plurality of gate structures (e.g., 316/318) above a substrate (e.g., 302). Each of the gate structures (e.g., 316/318) includes a gate insulating layer (e.g., 324) thereon. Each of the plurality of gate structures (e.g., 316/318) includes a conductive tap structure (e.g., 320) protruding through the corresponding gate insulating layer (e.g., 324). A plurality of conductive trench contact structures (e.g., 310, or ultimately at locations 310) is alternating with the plurality of gate structures (e.g., 316/318). In one embodiment, each of the conductive trench contact structures including a trench insulating layer thereon (e.g., as ultimately formed at locations 310, examples of which are described below).

In an embodiment, as described in examples described below, an interlayer dielectric material is above the trench insulating layers (e.g., locations 310) and the gate insulating layers (e.g., 324). An opening is formed in the interlayer dielectric material. The opening exposes the conductive tap structure (e.g., 320) of one of the plurality of gate structures (e.g., 316/318). As described in example, below, in an embodiment, a conductive structure is in the opening. The conductive structure in direct contact with the conductive tap structure (e.g., 320) of one of the plurality of gate structures (e.g., 316/318). In an embodiment, such an opening further exposes a portion of the corresponding gate insulating layer (e.g., 324). In a particular such embodiment, the opening further exposes a trench insulating layer of a neighboring one of the plurality of conductive trench contact structures (e.g., at location 310).

In an embodiment, the integrated circuit structure further includes a plurality of dielectric spacers (e.g., 308) alternating with the plurality of gate structures (e.g., 316/318) and the plurality of conductive trench contact structures (e.g., locations 310). In one such embodiment, the opening further exposes a portion of one of the plurality of dielectric spacers (e.g., 308).

In an embodiment, the trench insulating layers and the gate insulating layers include a different material. In one such embodiment, the trench insulating layers include silicon carbide, and the gate insulating layers include silicon nitride.

In an embodiment, the plurality of conductive trench contact structures (e.g., locations 310) and the plurality of gate structures (e.g., 316/318) are on a semiconductor fin. In one such embodiment, the conductive tap structure (e.g., 320) of the one of the plurality of gate structures (e.g., 316/318) is over the semiconductor fin.

Figure 5A:
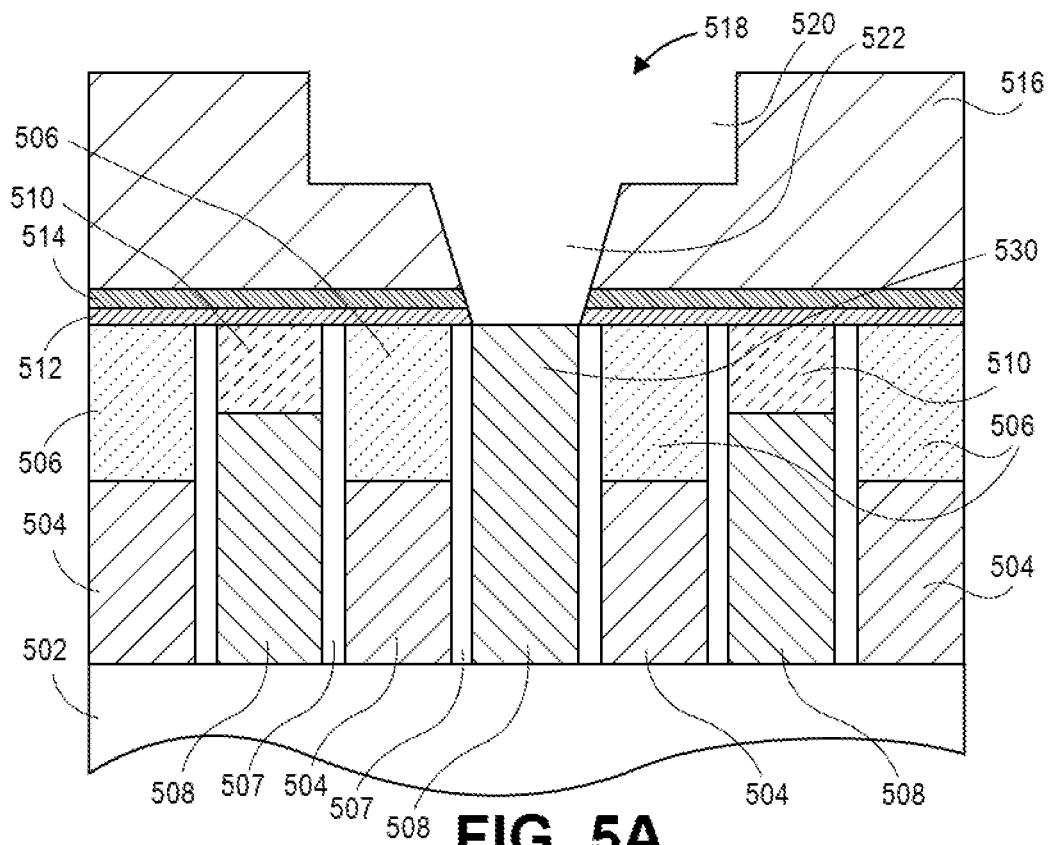
FIGS. 5A-5B illustrate cross-sectional views representing various operations in a method of fabricating a semiconductor structure having a gate contact structure disposed over an active portion of a gate, in accordance with an embodiment of the present disclosure.
Figure 5B:
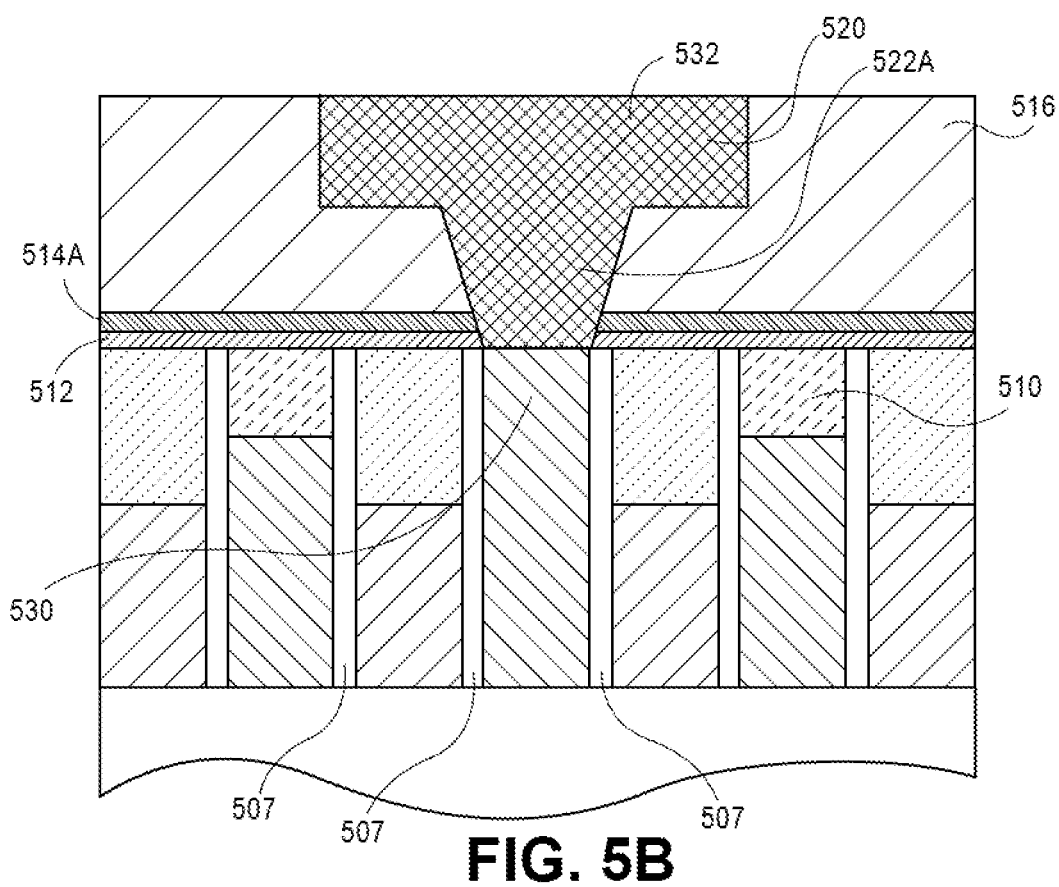

As an exemplary fabrication scheme, FIGS. 5A-5B illustrate cross-sectional views representing various operations in a method of fabricating a semiconductor structure having a gate contact structure disposed over an active portion of a gate, in accordance with an embodiment of the present disclosure.

Referring to FIG. 5A, a plurality of gate structures 508 is formed above a fin or substrate 502. Gate structures 508 may include a gate dielectric and gate electrode. Each of the gate structures 508 includes a gate insulating layer (GILA) 510 or gate dielectric cap thereon. However, at the location depicted, the central one of the gate structures 508 has a conductive gate tap 530 in place of a portion of the corresponding GILA. Dielectric spacers 507 may be along sidewalls of the each gate stack 508/GILA 510 pairing. The gate structures 508 alternate with conductive trench contact structures 504. Each of the conductive trench contact structures 504 includes a trench insulating layer (TILA) 506 or contact dielectric cap thereon.

In a particular embodiment, as is depicted in FIG. 5A, a first dielectric etch stop layer 512 is directly on and is continuous over the trench insulating layers 506 and the gate insulating layers 510 and, possibly, the dielectric spacers 507. A second dielectric etch stop layer 514 is directly on and continuous over the first dielectric etch stop layer 512. The second dielectric etch stop layer 514 is distinct from the first dielectric etch stop layer 512. In a particular embodiment, the second dielectric etch stop layer 514 is composed of aluminum oxide, and the first dielectric etch stop layer 512 is composed of silicon nitride.

Referring again to FIG. 5A, an interlayer dielectric (ILD) material 516 is on the second dielectric etch stop layer 514. An opening 518 is formed in the ILD material 516. The opening 518 may include a trench portion 520 and a via portion 522. In an embodiment, opening 518 is formed in ILD material 516 using dry or plasma etch process. An initial etch process may stops on the second dielectric etch stop layer 514. The second dielectric etch stop layer 514 and the first dielectric etch stop layer 512 may then be patterned together or sequentially. It is to be appreciated that a single etch stop layer or no etch stop layer may instead be used. In any case, the via portion 522 of the opening 518 exposes the conductive gate tap 530 of the central one of the gate structures 508.

Referring to FIG. 5B, a conductive structure 532 is formed in opening 518. In an embodiment, conductive structure 532 includes an upper conductive line or interconnect and a lower conductive via, as is depicted. In an embodiment, the conductive structure 532 is in electrical contact with conductive gate tap 530 of the central one of the gate structures 508.

In accordance with one or more embodiments of the present disclosure, etch stop layers stacks are implemented to provide for improved via contact selectivity to TILA/GILA and for substantially improved yield. In an embodiment, a via opening etch lands on an upper dielectric etch stop layer with very high selectivity. The upper dielectric etch stop layer is etched with selectivity to an underlying lower dielectric etch stop layer. The lower dielectric etch stop layer is then etched to expose underlying TILA/GILA regions. The multi-operation breakthrough process may be implemented to reduce loss to the underlying TILA/GILA regions and enable significant yield improvement.

As an exemplary fabrication scheme, a starting structure includes one or more gate stack structures disposed above a substrate. The gate stack structures may include a gate dielectric layer and a gate electrode. Trench contacts, e.g., contacts to diffusion regions of the substrate or to epitaxial region formed within the substrate are spaced apart from gate stack structures by dielectric spacers. An insulating cap layer may be disposed on the gate stack structures (e.g., GILA). In one embodiment, contact blocking regions or "contact plugs", which may be fabricated from an inter-layer dielectric material, are included in regions where contact formation is to be blocked.

In an embodiment, the contact pattern is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Next, the trench contacts may be recessed to provide recessed trench contacts that have a height below the top surface of adjacent spacers. An insulating cap layer is then formed on the recessed trench contacts (e.g., TILA). In accordance with an embodiment of the present disclosure, the insulating cap layer on the recessed trench contacts is composed of a material having a different etch characteristic than insulating cap layer on the gate stack structures.

The trench contacts may be recessed by a process selective to the materials of the spacers and the gate insulating cap layer. For example, in one embodiment, the trench contacts are recessed by an etch process such as a wet etch process or dry etch process. The trench contact insulating cap layer may be formed by a process suitable to provide a conformal and sealing layer above the exposed portions of the trench contacts. For example, in one embodiment, the trench contact insulating cap layer is formed by a chemical vapor deposition (CVD) process as a conformal layer above the entire structure. The conformal layer is then planarized, e.g., by chemical mechanical polishing (CMP), to provide the trench contact insulating cap layer material only above the recessed trench contacts.

Regarding suitable material combinations for gate or trench contact insulating cap layers, in one embodiment, one of the pair of gate versus trench contact insulating cap material is composed of silicon oxide while the other is composed of silicon nitride. In another embodiment, one of the pair of gate versus trench contact insulating cap material is composed of silicon oxide while the other is composed of carbon doped silicon nitride. In another embodiment, one of the pair of gate versus trench contact insulating cap material is composed of silicon oxide while the other is composed of silicon carbide. In another embodiment, one of the pair of gate versus trench contact insulating cap material is composed of silicon nitride while the other is composed of carbon doped silicon nitride. In another embodiment, one of the pair of gate versus trench contact insulating cap material is composed of silicon nitride while the other is composed of silicon carbide. In another embodiment, one of the pair of gate versus trench contact insulating cap material is composed of carbon doped silicon nitride while the other is composed of silicon carbide.

Figure 5C:
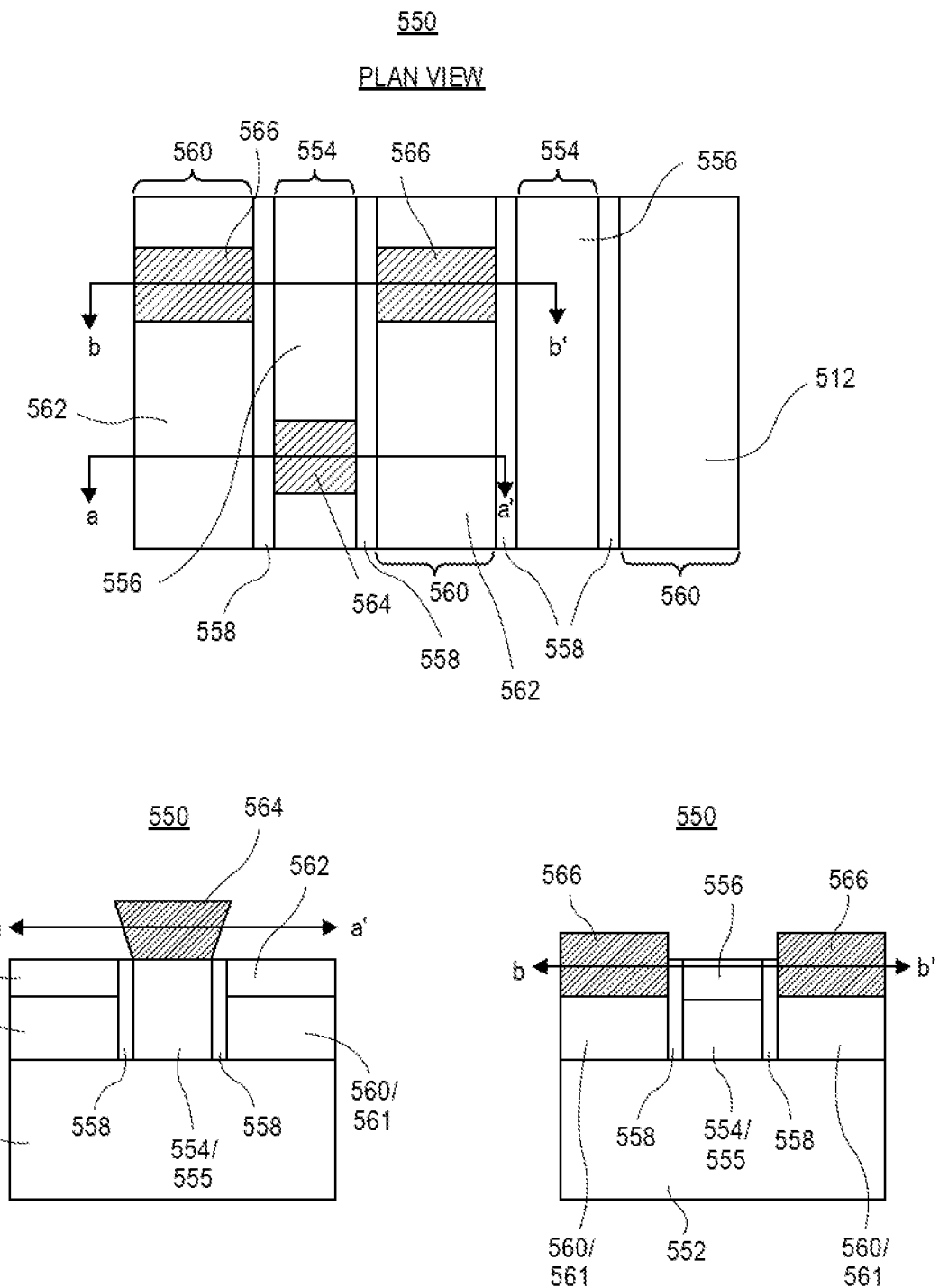
FIG. 5C illustrates a plan view and corresponding cross-sectional views of an integrated circuit structure having trench contacts and a gate contact, in accordance with an embodiment of the present disclosure.

As an exemplary structure, FIG. 5C illustrates a plan view and corresponding cross-sectional views of an integrated circuit structure having trench contacts and a gate contact, in accordance with an embodiment of the present disclosure.

Referring to FIG. 5C, an integrated circuit structure 550 includes a gate line 554 above a semiconductor substrate or fin 552, such as a silicon fin. The gate line 554 includes a gate stack 555 (e.g., including a gate dielectric layer or stack and a gate electrode on the gate dielectric layer or stack) and a gate insulating cap layer 556 on the gate stack 555. Dielectric spacers 558 are along sidewalls of the gate stack 555 and, in an embodiment, along sidewalls of the gate insulating cap layer 556, as is depicted.

Trench contacts 560 are adjacent the sidewalls of the gate line 554, with the dielectric spacers 558 between the gate line 554 and the trench contacts 560. Individual ones of the trench contacts 560 include a conductive contact structure 561 and a trench contact insulating cap layer 562 on the conductive contact structure 561.

Referring again to FIG. 5C, a gate contact via 564 is formed on a gate tap feature (e.g., a non-recessed portion) disposed within an opening of the gate insulating cap layer 556. The gate contact via 564 makes electrical contact with the gate stack 555 at the location of the gate tap feature. In an embodiment, the gate contact via 564 electrically contacts the gate stack 555 at a location over the semiconductor substrate or fin 552 and laterally between the trench contacts 560, as is depicted. In one such embodiment, the trench contact insulating cap layer 562 on the conductive contact structure 561 prevents gate to source shorting or gate to drain shorting by the gate contact via 564.

Referring again to FIG. 5C, trench contact vias 566 are formed in an opening of the trench contact insulating cap layer 562 and electrically contact the respective conductive contact structures 561. In an embodiment, the trench contact vias 566 electrically contact the respective conductive contact structures 561 at locations over the semiconductor substrate or fin 552 and laterally adjacent the gate stack 555 of the gate line 554, as is depicted. In one such embodiment, the gate insulating cap layer 556 on the gate stack 555 prevents source to gate shorting or drain to gate shorting by the trench contact vias 566.

It is to be appreciated that differing structural relationships between an insulating gate cap layer and an insulating trench contact cap layer may be fabricated. As examples, FIGS. 6A-6F illustrate cross-sectional views of various integrated circuit structures, each having trench contacts including an overlying insulating cap layer and having gate stacks including an overlying insulating cap layer, in accordance with an embodiment of the present disclosure.

Figure 6A:
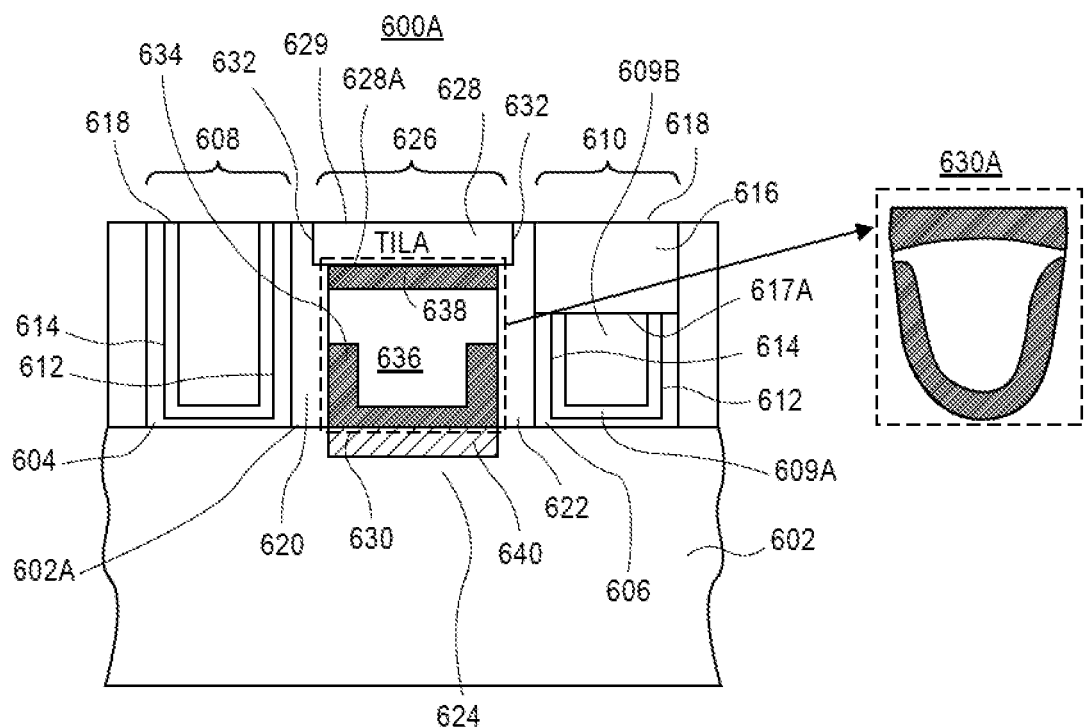
FIGS. 6A-6F illustrate cross-sectional views of various integrated circuit structures, each having trench contacts including an overlying insulating cap layer and having gate stacks including an overlying insulating cap layer, in accordance with an embodiment of the present disclosure.
Figure 6B:
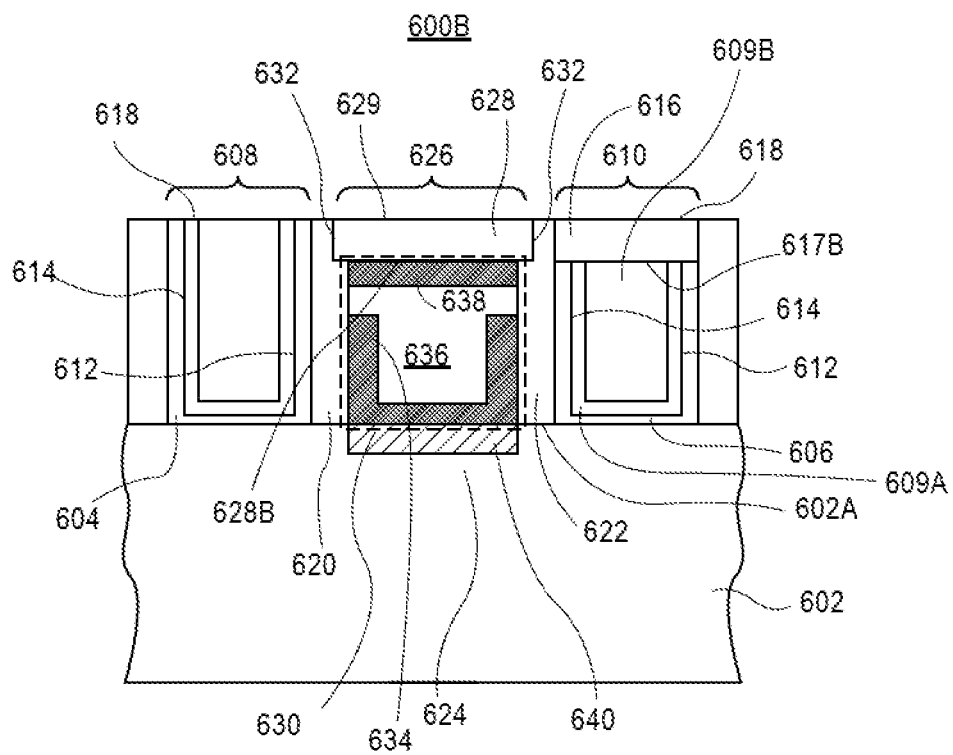
Figure 6C:
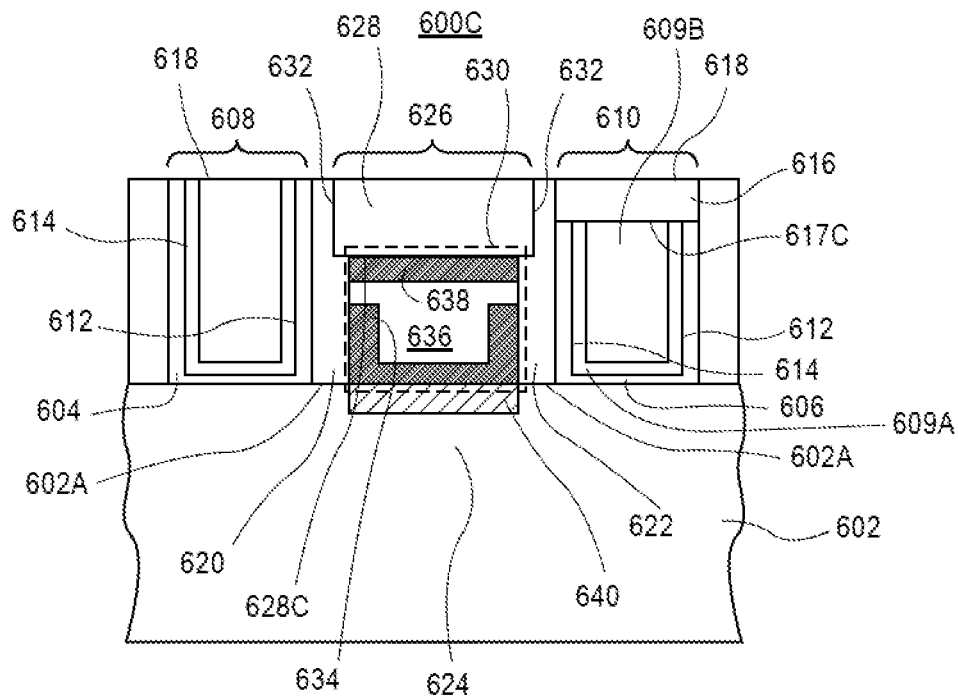

Referring to FIGS. 6A, 6B and 6C, integrated circuit structures 600A, 600B and 600C, respectively, each include a fin 602, such as a silicon fin. Although depicted as a cross-sectional view, it is to be appreciated that the fin 602 has a top 602A and sidewalls (into and out of the page of the perspective shown). First 604 and second 606 gate dielectric layers are over the top 602A of the fin 602 and laterally adjacent the sidewalls of the fin 602. First 608 and second 610 gate electrodes are over the first 604 and second 606 gate dielectric layers, respectively, over the top 602A of the fin 602 and laterally adjacent the sidewalls of the fin 602. The first 608 and second 610 gate electrodes each include a conformal conductive layer 609A, such as a workfunction-setting layer, and a conductive fill material 609B above the conformal conductive layer 609A. The first 608 and second 610 gate electrodes both have a first side 612 and a second side 614 opposite the first side 612. The first 608 and second 610 gate electrodes also both have an insulating cap 616 having a top surface 618.

In accordance with an embodiment of the present disclosure, one or more portions of first 608 and second 610 gate electrodes have a retained conductive gate tap structure. For example, in each of FIGS. 6A, 6B, 6C, 6D and 6F, the gate structure on the right (gate electrode 610) is shown at a location that includes an overlying gate insulating cap. However, the gate structure on the left (gate electrode 608) is shown at a location that includes a preserved conductive gate tap structure and, as such, does not include an overlying gate insulating cap portion at that location.

A first dielectric spacer 620 is adjacent the first side 612 of the first gate electrode 608. A second dielectric spacer 622 is adjacent the second side 614 of the second gate electrode 610. A semiconductor source or drain region 624 is adjacent the first 620 and second 622 dielectric spacers. A trench contact structure 626 is over the semiconductor source or drain region 624 adjacent the first 620 and second 622 dielectric spacers.

The trench contact structure 626 includes an insulating cap 628 on a conductive structure 630. The insulating cap 628 of the trench contact structure 626 has a top surface 629 substantially co-planar with a top surfaces 618 of the insulating caps 616 of the first 608 and second 610 gate electrodes. In an embodiment, the insulating cap 628 of the trench contact structure 626 extends laterally into recesses 632 in the first 620 and second 622 dielectric spacers. In such an embodiment, the insulating cap 628 of the trench contact structure 626 overhangs the conductive structure 630 of the trench contact structure 626. In other embodiments, however, the insulating cap 628 of the trench contact structure 626 does not extend laterally into recesses 632 in the first 620 and second 622 dielectric spacers and, hence, does not overhang the conductive structure 630 of the trench contact structure 626.

It is to be appreciated that the conductive structure 630 of the trench contact structure 626 may not be rectangular, as depicted in FIGS. 6A-6C. For example, the conductive structure 630 of the trench contact structure 626 may have a cross-sectional geometry similar to or the same as the geometry shown for conductive structure 630A illustrated in the projection of FIG. 6A.

In an embodiment, the insulating cap 628 of the trench contact structure 626 has a composition different than a composition of the insulating caps 616 of the first 608 and second 610 gate electrodes. In one such embodiment, the insulating cap 628 of the trench contact structure 626 includes a carbide material, such as a silicon carbide material. The insulating caps 616 of the first 608 and second 610 gate electrodes include a nitride material, such as a silicon nitride material.

In an embodiment, the insulating caps 616 of the first 608 and second 610 gate electrodes both have a bottom surface 617A below a bottom surface 628A of the insulating cap 628 of the trench contact structure 626, as is depicted in FIG. 6A. In another embodiment, the insulating caps 616 of the first 608 and second 610 gate electrodes both have a bottom surface 617B substantially co-planar with a bottom surface 628B of the insulating cap 628 of the trench contact structure 626, as is depicted in FIG. 6B. In another embodiment, the insulating caps 616 of the first 608 and second 610 gate electrodes both have a bottom surface 617C above a bottom surface 628C of the insulating cap 628 of the trench contact structure 626, as is depicted in FIG. 6C.

In an embodiment, the conductive structure 630 of the trench contact structure 628 includes a U-shaped metal layer 634, a T-shaped metal layer 636 on and over the entirety of the U-shaped metal layer 634, and a third metal layer 638 on the T-shaped metal layer 636. The insulating cap 628 of the trench contact structure 626 is on the third metal layer 638. In one such embodiment, the third metal layer 638 and the U-shaped metal layer 634 include titanium, and the T-shaped metal layer 636 includes cobalt. In a particular such embodiment, the T-shaped metal layer 636 further includes carbon.

In an embodiment, a metal silicide layer 640 is directly between the conductive structure 630 of the trench contact structure 626 and the semiconductor source or drain region 624. In one such embodiment, the metal silicide layer 640 includes titanium and silicon. In a particular such embodiment, the semiconductor source or drain region 624 is an N-type semiconductor source or drain region. In another embodiment, the metal silicide layer 640 includes nickel, platinum and silicon. In a particular such embodiment, the semiconductor source or drain region 624 is a P-type semiconductor source or drain region. In another particular such embodiment, the metal silicide layer further includes germanium.

Figure 6D:
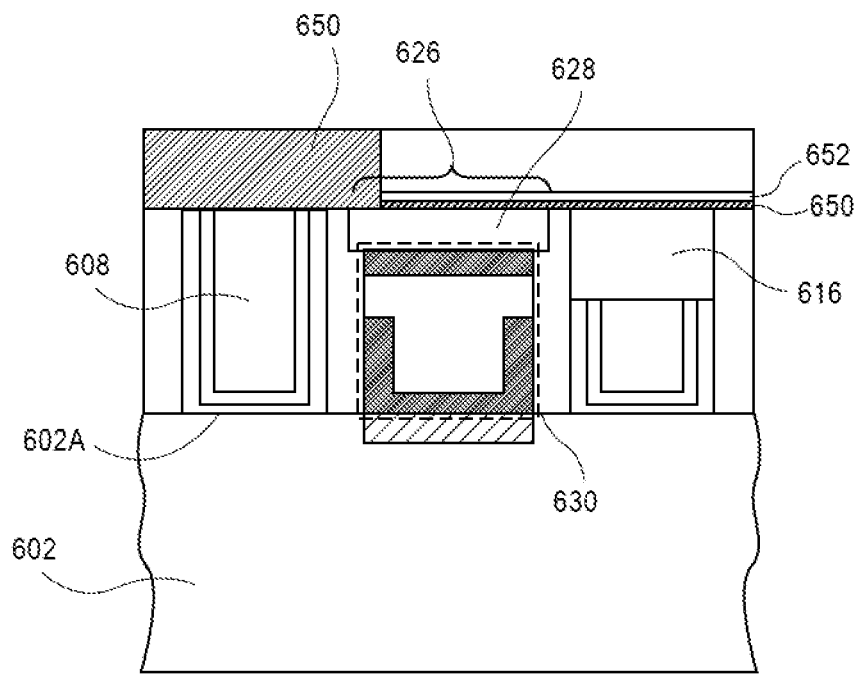

In an embodiment, referring to FIG. 6D, a conductive via 650 is on and electrically connected to a gate tap portion of the first gate electrode 608 over the top 602A of the fin 602. The conductive via 650 is in an opening in a first dielectric etch stop layer 650 (such as described in association with first dielectric etch stop layer 512) and a second dielectric etch stop layer 652 (such as described in association with second dielectric etch stop layer 514). In one such embodiment, the conductive via 650 is on a portion of the insulating cap 628 of the trench contact structure 626 but is not electrically connected to the conductive structure 630 of the trench contact structure 626.

Figure 6E:
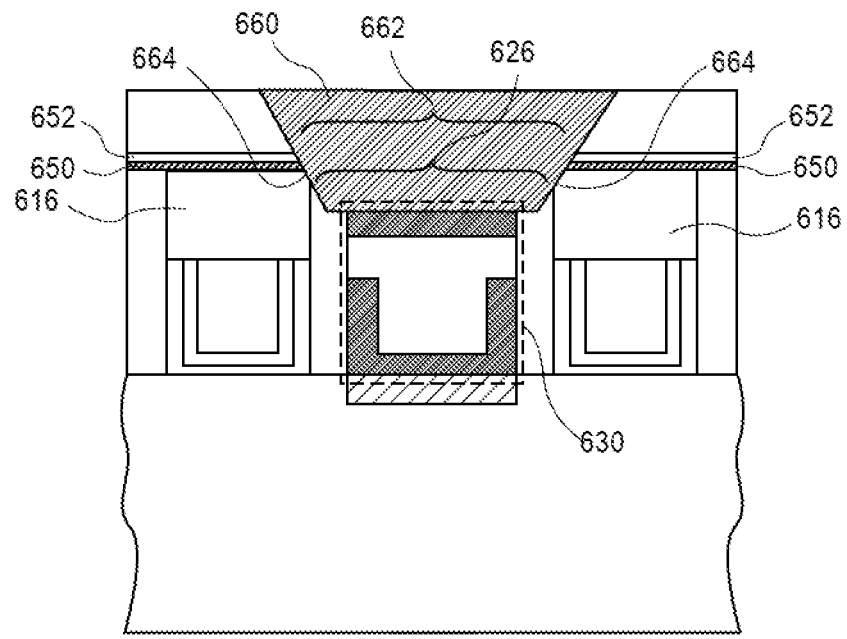

In an embodiment, referring to FIG. 6E, a conductive via 660 is on and electrically connected to a portion of the trench contact structure 626. The conductive via is in an opening in a first dielectric etch stop layer 650 (such as described in association with first dielectric etch stop layer 512) and a second dielectric etch stop layer 652 (such as described in association with second dielectric etch stop layer 514) an further in an opening 662 of the insulating cap 628 of the trench contact structure 626. In one such embodiment, the conductive via 660 is on a portion of the insulating caps 616 of the first 608 and second 610 gate electrodes but is not electrically connected to the first 608 and second 610 gate electrodes. In a particular such embodiment, the conductive via 660 is in an eroded portion 664 of the insulating caps 616 of the first 608 and second 610 gate electrodes.

Figure 6F:
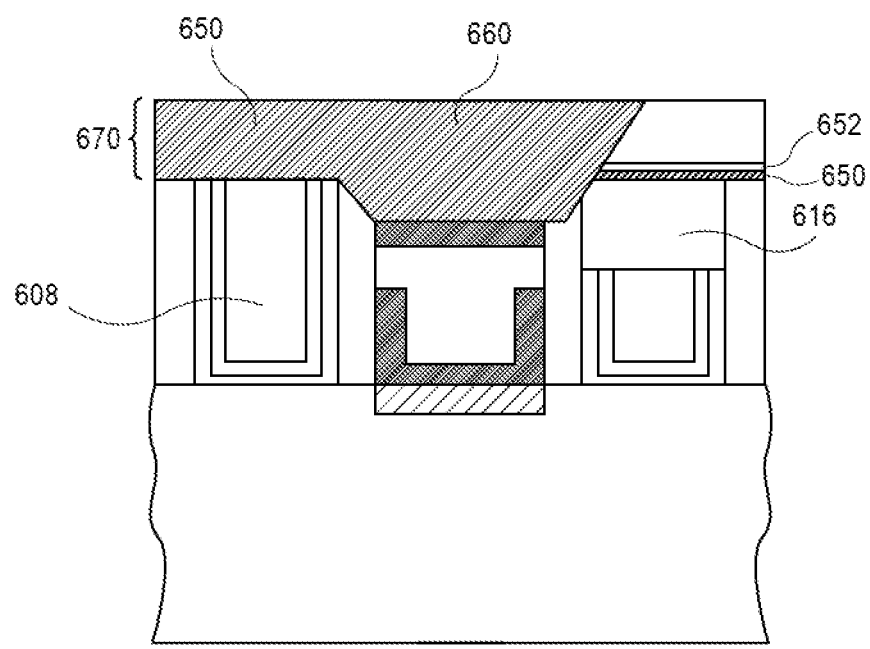

Referring again to FIG. 6E, in an embodiment, the conductive via 660 is a second conductive via in a same structure as the conductive via 650 of FIG. 6D. In one such embodiment, such a second conductive via 660 is isolated from the conductive via 650. In another such embodiment, such as second conductive via 660 is merged with the conductive via 650 to form an electrically shorting contact 670, as is depicted in FIG. 6F.

Figure 7A:
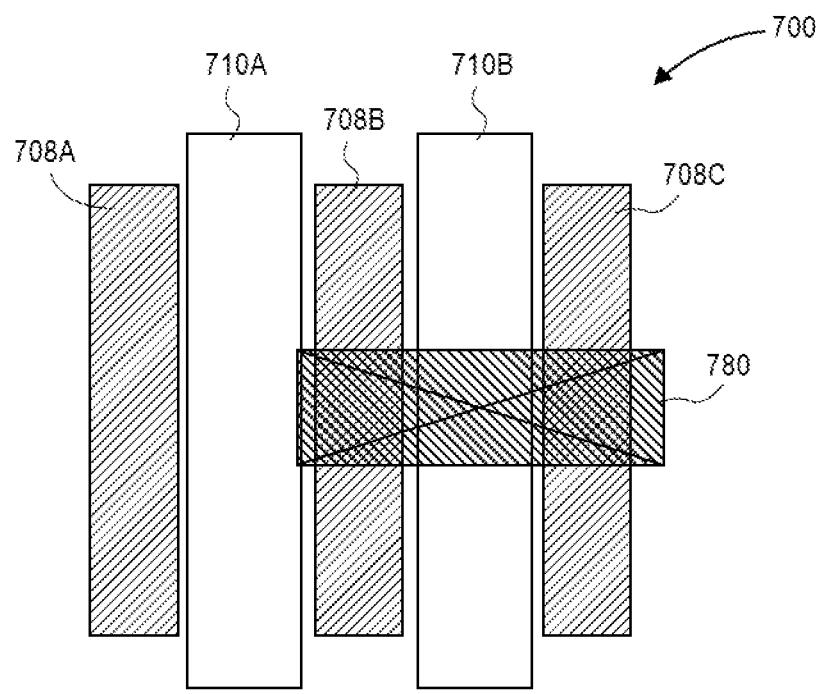
FIG. 7A illustrates a plan view of another semiconductor device having a gate contact via disposed over an active portion of a gate, in accordance with another embodiment of the present disclosure.

The approaches and structures described herein may enable formation of other structures or devices that were not possible or difficult to fabricate using other methodologies. In a first example, FIG. 7A illustrates a plan view of another semiconductor device having a gate contact via disposed over an active portion of a gate, in accordance with another embodiment of the present disclosure. Referring to FIG. 7A, a semiconductor structure or device 700 includes a plurality of gate structures 708A-708C interdigitated with a plurality of trench contacts 710A and 710B (these features are disposed above an active region of a substrate, not shown). A gate contact via 780 is formed on an active portion the gate structure 708B. The gate contact via 780 is further disposed on the active portion of the gate structure 708C, coupling gate structures 708B and 708C. It is to be appreciated that the intervening trench contact 710B may be isolated from the contact 780 by using a trench contact isolation cap layer (e.g., TILA). The contact configuration of FIG. 7A may provide an easier approach to strapping adjacent gate lines in a layout, without the need to route the strap through upper layers of metallization, hence enabling smaller cell areas or less intricate wiring schemes, or both.

Figure 7B:
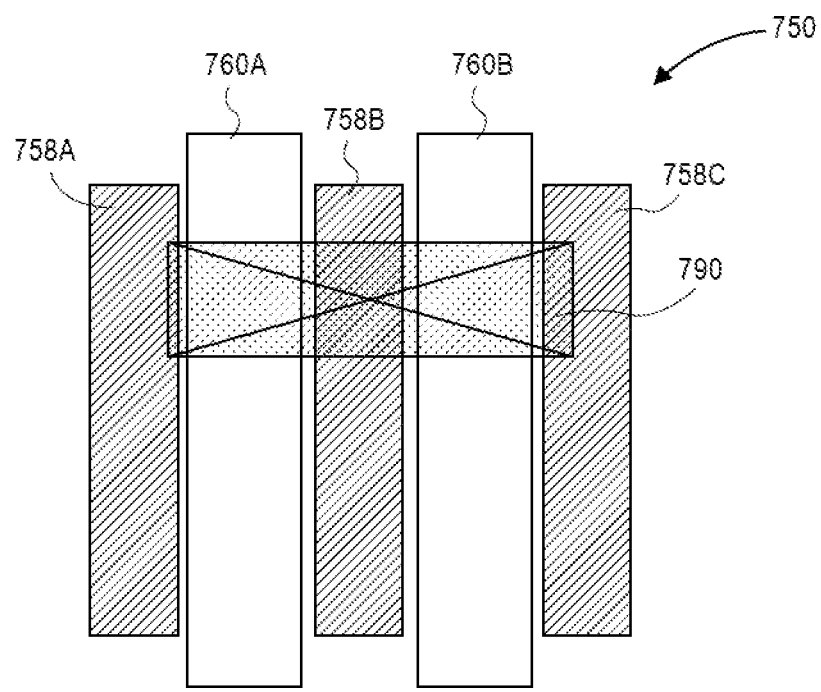
FIG. 7B illustrates a plan view of another semiconductor device having a trench contact via coupling a pair of trench contacts, in accordance with another embodiment of the present disclosure.

In a second example, FIG. 7B illustrates a plan view of another semiconductor device having a trench contact via coupling a pair of trench contacts, in accordance with another embodiment of the present disclosure. Referring to FIG. 7B, a semiconductor structure or device 750 includes a plurality of gate structures 758A-758C interdigitated with a plurality of trench contacts 760A and 760B (these features are disposed above an active region of a substrate, not shown). A trench contact via 790 is formed on the trench contact 760A. The trench contact via 790 is further disposed on the trench contact 760B, coupling trench contacts 760A and 760B. It is to be appreciated that the intervening gate structure 758B may be isolated from the trench contact via 790 by using a gate isolation cap layer (e.g., by a GILA process). The contact configuration of FIG. 7B may provide an easier approach to strapping adjacent trench contacts in a layout, without the need to route the strap through upper layers of metallization, hence enabling smaller cell areas or less intricate wiring schemes, or both.

An insulating cap layer for a gate electrode may be fabricated using several deposition operations and, as a result, may include artifacts of a multi-deposition fabrication process. As an example, FIGS. 8A-8F illustrate cross-sectional views representing various operations in a method of fabricating an integrated circuit structure with a gate stack having an overlying insulating cap layer, in accordance with an embodiment of the present disclosure.

Figure 8A:
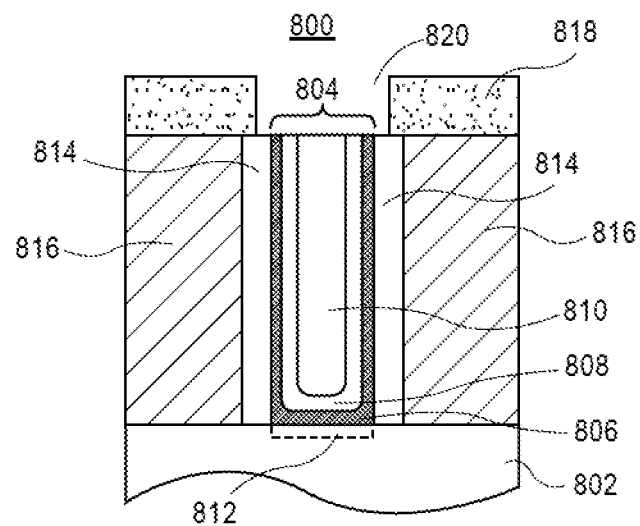
FIGS. 8A-8F illustrate cross-sectional views representing various operations in a method of fabricating an integrated circuit structure with a gate stack having an overlying insulating cap layer, in accordance with an embodiment of the present disclosure.

Referring to FIG. 8A, a starting structure 800 includes a gate stack 804 above a substrate or fin 802. The gate stack 804 includes a gate dielectric layer 806, a conformal conductive layer 808, and a conductive fill material 810. In an embodiment, the gate dielectric layer 806 is a high-k gate dielectric layer formed using an atomic layer deposition (ALD) process, and the conformal conductive layer is a workfunction layer formed using an ALD process. In one such embodiment, a thermal or chemical oxide layer 812, such as a thermal or chemical silicon dioxide or silicon oxide layer, is between the substrate or fin 802 and the gate dielectric layer 806. Dielectric spacers 814, such as silicon nitride spacers, are adjacent sidewalls of the gate stack 804. The dielectric gate stack 804 and the dielectric spacers 814 are housed in an inter-layer-dielectric (ILD) layer 816. In an embodiment, the gate stack 804 is formed using a replacement gate and replacement gate dielectric processing scheme. A mask 818 is patterned above the gate stack 804 and ILD layer 816 to provide an opening 820 exposing the gate stack 804.

Figure 8B:
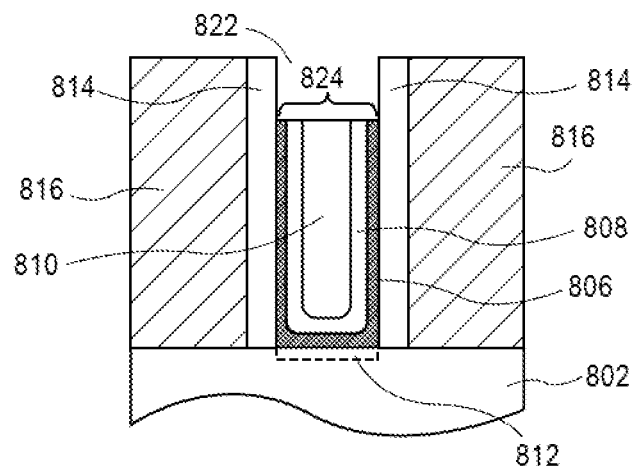

Referring to FIG. 8B, using a selective etch process or processes, the gate stack 804, including gate dielectric layer 806, conformal conductive layer 808, and conductive fill material 810, are recessed relative to dielectric spacers 814 and layer 816. Mask 818 is then removed. The recessing provides a cavity 822 above a recessed gate stack 824. It is to be appreciated that, in accordance with one or more embodiments described herein, one or more portions of the gate stack 804 may be masked to preserve a conductive gate tap location.

In another embodiment, not depicted, conformal conductive layer 808 and conductive fill material 810 are recessed relative to dielectric spacers 814 and layer 816, but gate dielectric layer 806 is not recessed or is only minimally recessed. It is to be appreciated that, in other embodiments, a maskless approach based on high etch selectivity is used for the recessing.

Figure 8C:
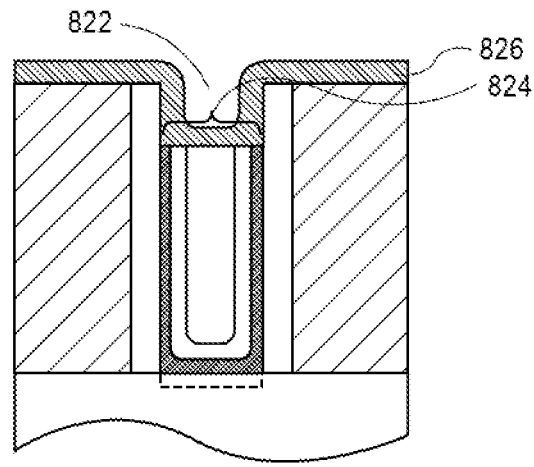

Referring to FIG. 8C, a first deposition process in a multi-deposition process for fabricating a gate insulating cap layer is performed. The first deposition process is used to form a first insulating layer 826 conformal with the structure of FIG. 8B. In an embodiment, the first insulating layer 826 includes silicon and nitrogen, e.g., the first insulating layer 826 is a silicon nitride ($Si_3N_4$) layer, a silicon rich silicon nitride layer, a silicon-poor silicon nitride layer, or a carbon-doped silicon nitride layer. In an embodiment, the first insulating layer 826 only partially fills the cavity 822 above the recessed gate stack 824, as is depicted.

Figure 8D:
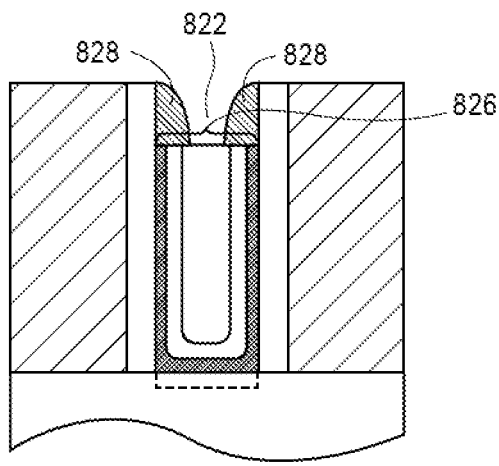

Referring to FIG. 8D, the first insulating layer 826 is subjected to an etch-back process, such as an anisotropic etch process, to provide first portions 828 of an insulating cap layer. The first portions 828 of an insulating cap layer only partially fill the cavity 822 above the recessed gate stack 824.

Figure 8E:
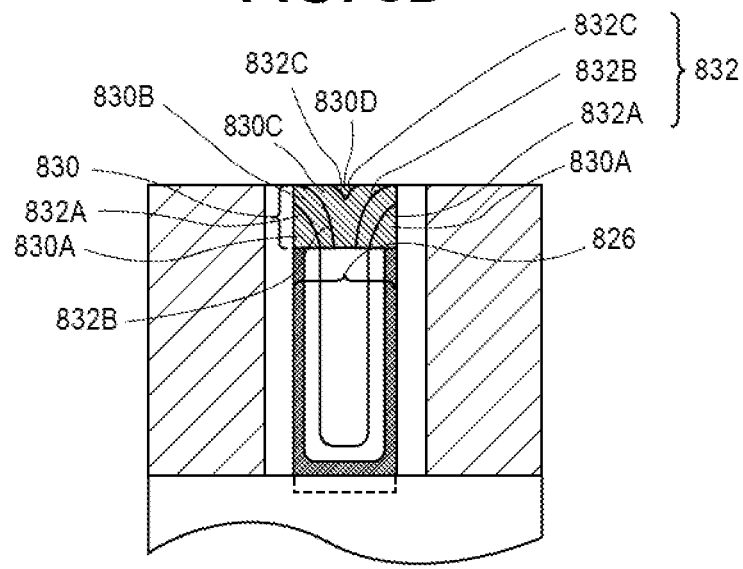

Referring to FIG. 8E, additional alternating deposition processes and etch-back processes are performed until cavity 822 is filled with an insulating gate cap structure 830 above the recessed gate stack 824. Seams 832 may be evident in cross-sectional analysis and may be indicative of the number of alternating deposition processes and etch-back processes used to insulating gate cap structure 830. In the example shown in FIG. 8E, the presence of three sets of seams 832A, 832B and 832C is indicative of four alternating deposition processes and etch-back processes used to insulating gate cap structure 830. In an embodiment, the material 830A, 830B, 830C and 830D of insulating gate cap structure 830 separated by seams 832 all have exactly or substantially the same composition. It is to be appreciated that, in accordance with one or more embodiments described herein, insulating gate cap structure 830 is not fabricated in locations where a conductive gate tap has been preserved.

Figure 8F:
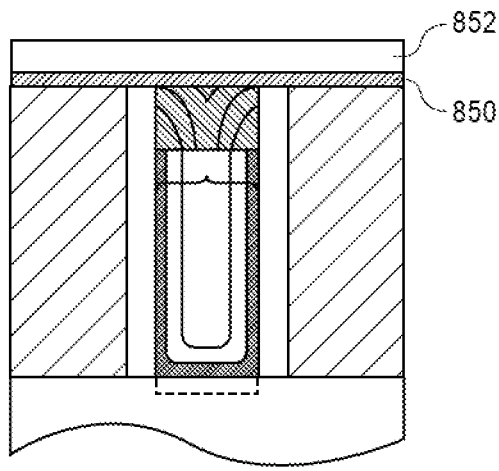

Referring to FIG. 8F, a first dielectric etch stop layer 850 (such as described in association with first dielectric etch stop layer 512) is formed on the structure of FIG. 8E. A second dielectric etch stop layer 852 (such as described in association with second dielectric etch stop layer 514) is formed on the first dielectric etch stop layer 850.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
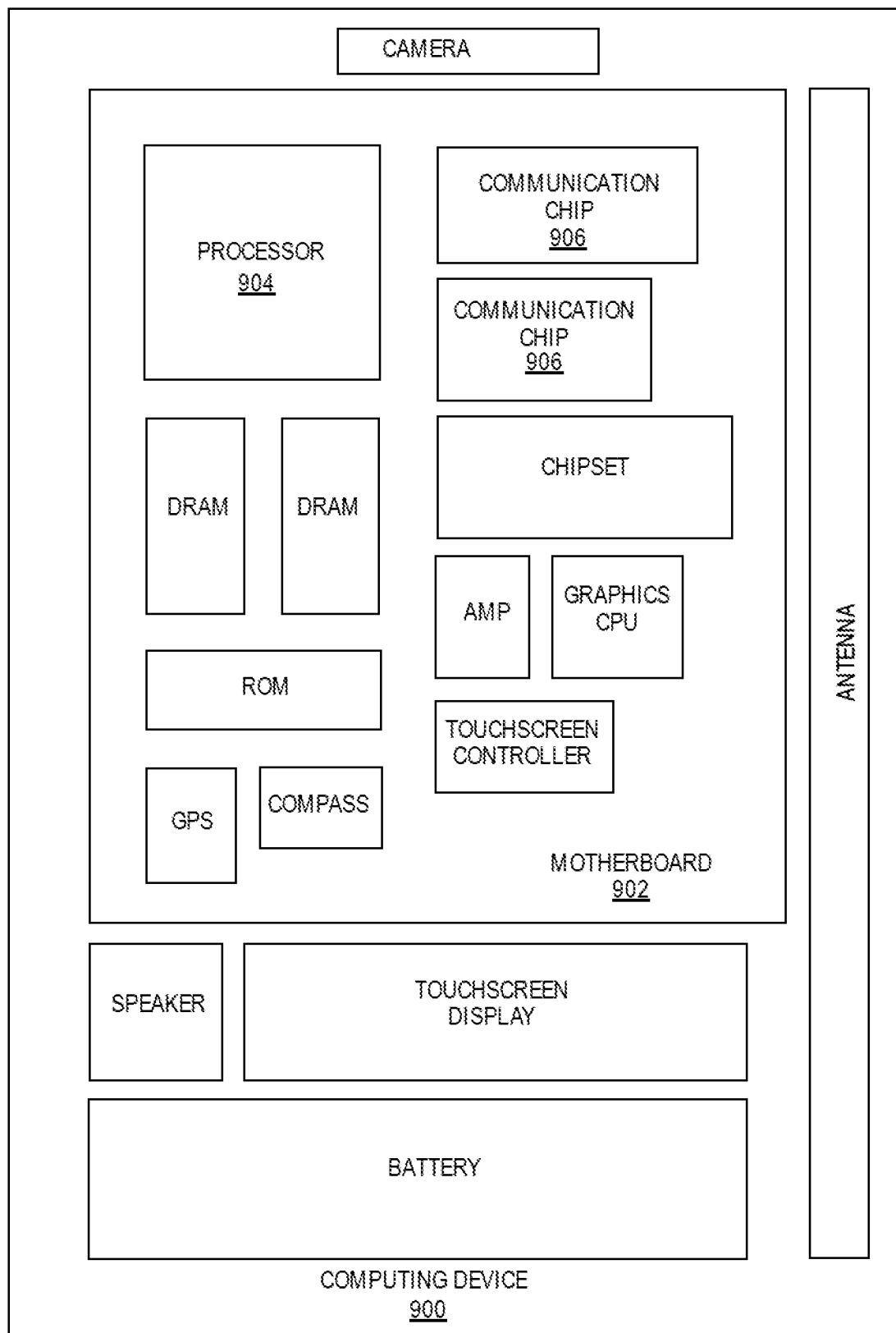
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 906 also includes an integrated circuit die packaged within the communication chip 906. In accordance with another implementation of the disclosure, the integrated circuit die of the communication chip is built in accordance with implementations of the disclosure.

In further implementations, another component housed within the computing device 900 may contain an integrated circuit die built in accordance with implementations of embodiments of the disclosure.

In various embodiments, the computing device 900 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
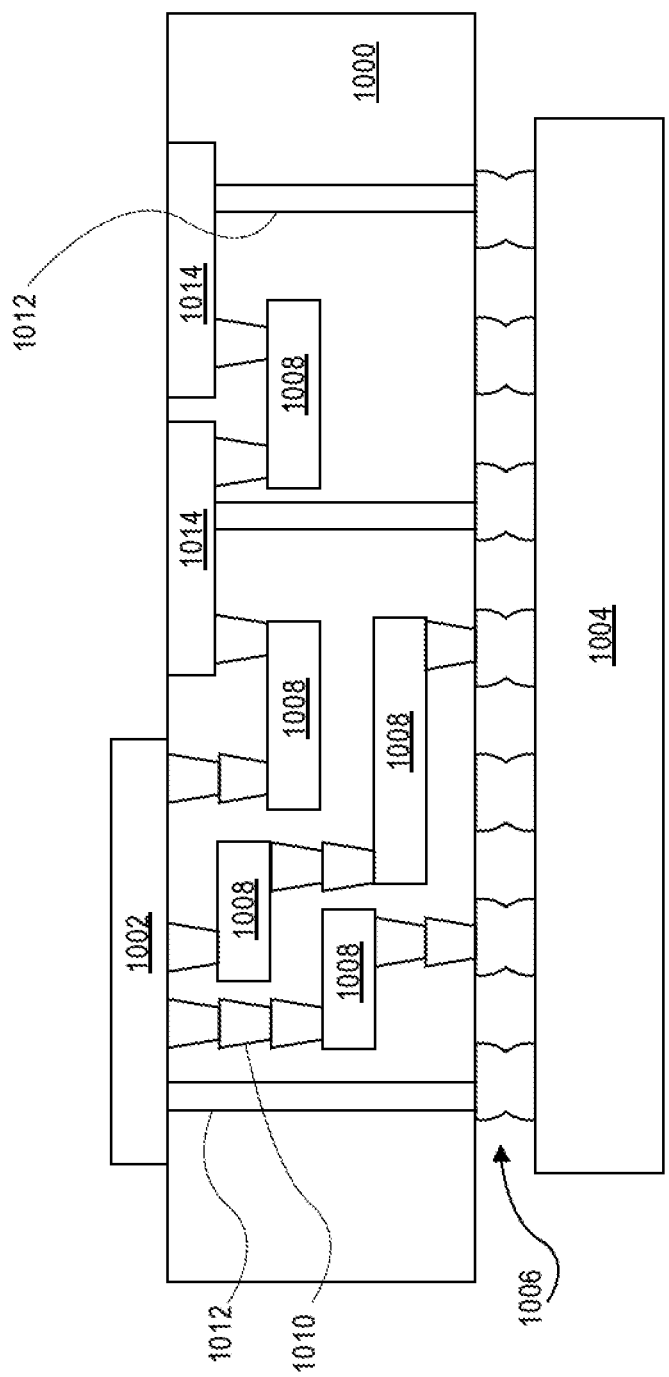
FIG. 10 illustrates an interposer that includes one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Figure 11:
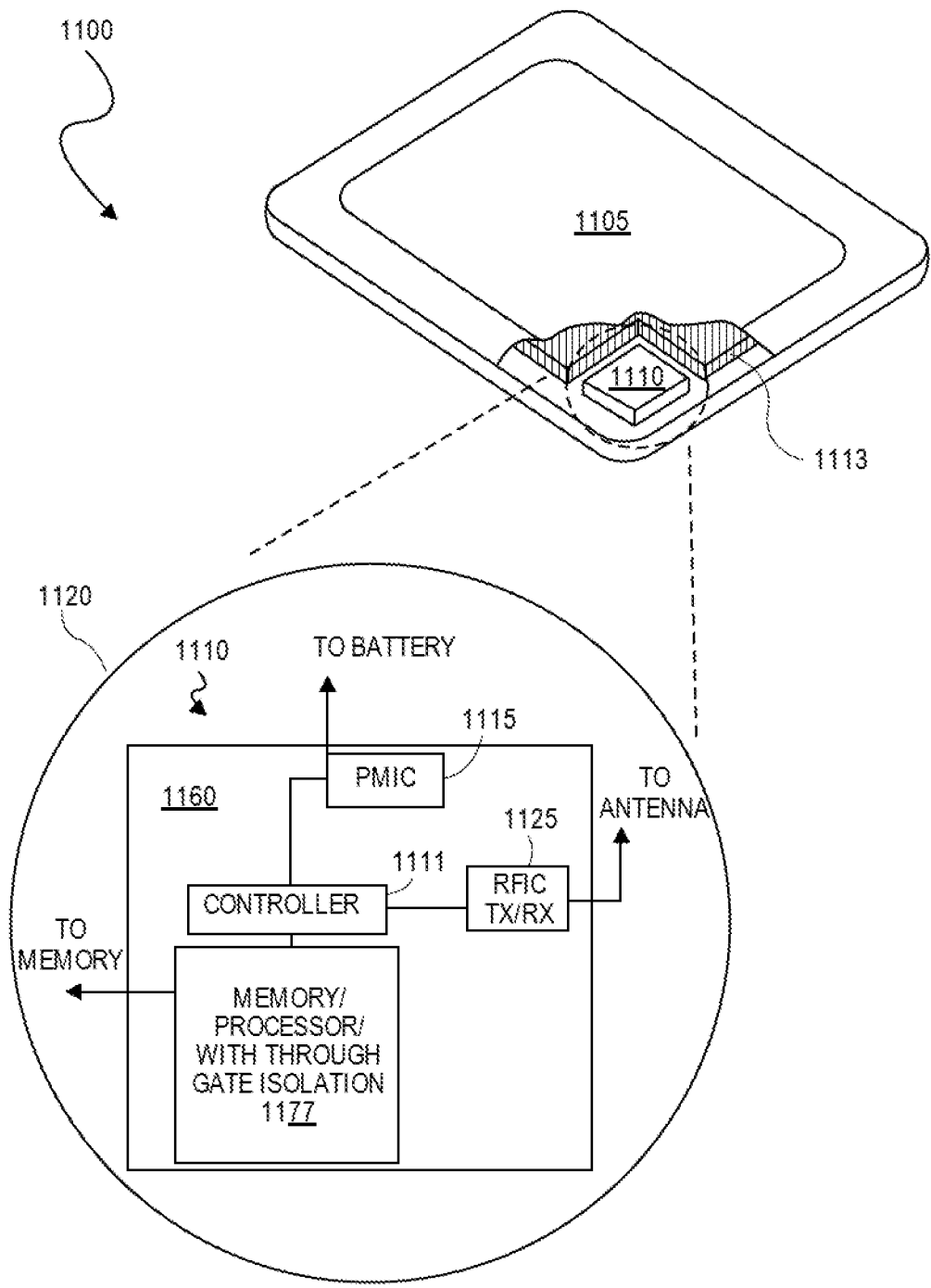
FIG. 11 is an isometric view of a mobile computing platform employing an IC fabricated according to one or more processes described herein or including one or more features described herein, in accordance with an embodiment of the present disclosure.

FIG. 11 is an isometric view of a mobile computing platform 1100 employing an integrated circuit (IC) fabricated according to one or more processes described herein or including one or more features described herein, in accordance with an embodiment of the present disclosure.

The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105 which in the exemplary embodiment is a touchscreen (capacitive, inductive, resistive, etc.), a chip-level (SoC) or package-level integrated system 1110, and a battery 1113. As illustrated, the greater the level of integration in the system 1110 enabled by higher transistor packing density, the greater the portion of the mobile computing platform 1100 that may be occupied by the battery 1113 or non-volatile storage, such as a solid state drive, or the greater the transistor gate count for improved platform functionality. Similarly, the greater the carrier mobility of each transistor in the system 1110, the greater the functionality. As such, techniques described herein may enable performance and form factor improvements in the mobile computing platform 1100.

The integrated system 1110 is further illustrated in the expanded view 1120. In the exemplary embodiment, packaged device 1177 includes at least one memory chip (e.g., RAM), or at least one processor chip (e.g., a multi-core microprocessor and/or graphics processor) fabricated according to one or more processes described herein or including one or more features described herein. The packaged device 1177 is further coupled to the board 1160 along with one or more of a power management integrated circuit (PMIC) 1115, RF (wireless) integrated circuit (RFIC) 1125 including a wideband RF (wireless) transmitter and/or receiver (e.g., including a digital baseband and an analog front end module further includes a power amplifier on a transmit path and a low noise amplifier on a receive path), and a controller thereof 1111. Functionally, the PMIC 1115 performs battery power regulation, DC-to-DC conversion, etc., and so has an input coupled to the battery 1113 and with an output providing a current supply to all the other functional modules. As further illustrated, in the exemplary embodiment, the RFIC 1125 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1177 or within a single IC (SoC) coupled to the package substrate of the packaged device 1177.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

FIG. 12 illustrates a cross-sectional view of a flip-chip mounted die, in accordance with an embodiment of the present disclosure.

Referring to FIG. 12, an apparatus 1200 includes a die 1202 such as an integrated circuit (IC) fabricated according to one or more processes described herein or including one or more features described herein, in accordance with an embodiment of the present disclosure. The die 1202 includes metallized pads 1204 thereon. A package substrate 1206, such as a ceramic or organic substrate, includes connections 1208 thereon. The die 1202 and package substrate 1206 are electrically connected by solder balls 1210 coupled to the metallized pads 1204 and the connections 1208. An underfill material 1212 surrounds the solder balls 1210.

Processing a flip chip may be similar to conventional IC fabrication, with a few additional operations. Near the end of the manufacturing process, the attachment pads are metallized to make them more receptive to solder. This typically consists of several treatments. A small dot of solder is then deposited on each metallized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include contact over active gate (COAG) structures with conductive gate taps, and methods of fabricating contact over active gate (COAG) structures with conductive gate taps.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate structures above a substrate, each of the gate structures including a gate insulating layer thereon. Each of the plurality of gate structures includes a conductive tap structure protruding through the corresponding gate insulating layer. A plurality of conductive trench contact structures is alternating with the plurality of gate structures, each of the conductive trench contact structures including a trench insulating layer thereon. An interlayer dielectric material is above the trench insulating layers and the gate insulating layers. An opening is in the interlayer dielectric material, the opening exposing the conductive tap structure of one of the plurality of gate structures. A conductive structure is in the opening, the conductive structure in direct contact with the conductive tap structure of one of the plurality of gate structures.

Example embodiment 2: The integrated circuit structure of example embodiment 1, wherein the opening further exposes a portion of the corresponding gate insulating layer.

Example embodiment 3: The integrated circuit structure of example embodiment 1 or 2, wherein the opening further exposes a trench insulating layer of a neighboring one of the plurality of conductive trench contact structures.

Example embodiment 4: The integrated circuit structure of example embodiment 1, 2 or 3, wherein the trench insulating layers and the gate insulating layers include a different material.

Example embodiment 5: The integrated circuit structure of example embodiment 4, wherein the trench insulating layers include silicon carbide, and the gate insulating layers include silicon nitride.

Example embodiment 6: The integrated circuit structure of example embodiment 4, wherein the trench insulating layers include silicon nitride, and the gate insulating layers include silicon carbide.

Example embodiment 7: The integrated circuit structure of example embodiment 1, 2, 3, 4, 5 or 6, further including a plurality of dielectric spacers alternating with the plurality of gate structures and the plurality of conductive trench contact structures, wherein the opening further exposes a portion of one of the plurality of dielectric spacers.

Example embodiment 8: The integrated circuit structure of example embodiment 1, 2, 3, 4, 5, 6 or 7, wherein the plurality of conductive trench contact structures and the plurality of gate structures are on a semiconductor fin, and the conductive tap structure of the one of the plurality of gate structures is over the semiconductor fin.

Example embodiment 9: The integrated circuit structure of example embodiment 1, 2, 3, 4, 5, 6, 7 or 8, wherein the conductive structure includes an upper conductive line and a lower conductive via.

Example embodiment 10: An integrated circuit structure includes a plurality of gate structures above a substrate, each of the gate structures including a gate insulating layer thereon. Each of the plurality of gate structures includes a conductive tap structure protruding through the corresponding gate insulating layer. A plurality of conductive trench contact structures is alternating with the plurality of gate structures, each of the conductive trench contact structures including a trench insulating layer thereon. An interlayer dielectric material is above the trench insulating layers and the gate insulating layers. An opening is in the interlayer dielectric material and in one of the trench insulating layers. A conductive structure is in the opening, the conductive structure in direct contact with a corresponding one of the trench contact structures.

Example embodiment 11: The integrated circuit structure of example embodiment 10, wherein the trench insulating layers and the gate insulating layers include a different material.

Example embodiment 12: The integrated circuit structure of example embodiment 11, wherein the trench insulating layers include silicon carbide, and the gate insulating layers include silicon nitride.

Example embodiment 13: The integrated circuit structure of example embodiment 11, wherein the trench insulating layers include silicon nitride, and the gate insulating layers include silicon carbide.

Example embodiment 14: The integrated circuit structure of example embodiment 10, 11, 12 or 13, further including a plurality of dielectric spacers alternating with the plurality of gate structures and the plurality of conductive trench contact structures.

Example embodiment 15: The integrated circuit structure of example embodiment 14, wherein the opening further exposes a portion of one of the plurality of dielectric spacers.

Example embodiment 16: The integrated circuit structure of example embodiment 11, 12, 13, 14 or 15, wherein the plurality of conductive trench contact structures and the plurality of gate structures are on a semiconductor fin.

Example embodiment 17: The integrated circuit structure of example embodiment 16, wherein the conductive tap structure of the one of the plurality of gate structures is over the semiconductor fin.

Example embodiment 18: The integrated circuit structure of example embodiment 10, 11, 12, 13, 14, 15, 16 or 17, wherein the conductive structure includes an upper conductive line and a lower conductive via.

Example embodiment 19: A method of fabricating an integrated circuit structure includes forming a gate structure within a dielectric structure above a substrate. The method also includes masking a portion of the gate structure. The method also includes recessing an unmasked portion of the gate structure within the dielectric structure. The method also includes forming a gate insulating cap layer on the recessed unmasked portion of the gate structure. The method also includes exposing the masked portion of the gate structure to form a conductive tap structure.

Example embodiment 20: The method of example embodiment 19, further including forming an interlayer dielectric material above the gate insulating layer and the dielectric structure, forming an opening in the interlayer dielectric material, the opening exposing the conductive tap structure of the gate structure, and forming a conductive structure in the opening, the conductive structure in direct contact with the conductive tap structure.

Example embodiment 21: A method of fabricating an integrated circuit structure includes forming a gate structure within a dielectric structure above a substrate. The method also includes recessing the gate structure within the dielectric structure. The method also includes masking a portion of the recessed gate structure. The method also includes further recessing an unmasked portion of the recessed gate structure within the dielectric structure. The method also includes forming a gate insulating cap layer on the further recessed unmasked portion of the gate structure. The method also includes exposing the masked portion of the recessed gate structure to form a conductive tap structure.

Example embodiment 22: The method of example embodiment 21, further including forming an interlayer dielectric material above the gate insulating layer and the dielectric structure, forming an opening in the interlayer dielectric material, the opening exposing the conductive tap structure of the gate structure, and forming a conductive structure in the opening, the conductive structure in direct contact with the conductive tap structure.

What is claimed is:

1. An integrated circuit structure, comprising:
   a fin;
   a gate structure over the fin, the gate structure including a recessed conductive portion and a non-recessed conductive portion;
   an insulating layer on the recessed conductive portion of the gate structure and laterally adjacent to the non-recessed conductive portion of the gate structure, wherein the insulating layer has an uppermost surface at a same level as an uppermost surface of the non-recessed conductive portion of the gate structure;
   a conductive trench contact structure laterally adjacent to the gate structure, the conductive trench contact structure including a trench insulating layer thereon;
   an interlayer dielectric material above the gate structure and the conductive trench contact;
   an opening in the interlayer dielectric material, the opening exposing the non-recessed conductive portion of the gate structure; and
   a conductive structure in the opening, the conductive structure in direct contact with the non-recessed conductive portion of the gate structure.

2. The integrated circuit structure of claim 1, wherein the opening further exposes a portion of the insulating layer.

3. The integrated circuit structure of claim 2, wherein the opening further exposes the trench insulating layer on the conductive trench contact structure.

4. The integrated circuit structure of claim 1, wherein the insulating layer and the trench insulating layer comprise a different material.

5. The integrated circuit structure of claim 4, wherein the trench insulating layer comprises silicon carbide, and the insulating layer comprise silicon nitride.

6. The integrated circuit structure of claim 1, further comprising:
   a dielectric spacer laterally between the conductive trench contact structure and the gate structure.

7. An integrated circuit structure, comprising:
   a three-dimensional body;
   a gate structure completely surrounding a channel region of the three-dimensional body, the gate structure including a recessed conductive portion and a non-recessed conductive portion;

an insulating layer on the recessed conductive portion of the gate structure and laterally adjacent to the non-recessed conductive portion of the gate structure, wherein the insulating layer has an uppermost surface at a same level as an uppermost surface of the non-recessed conductive portion of the gate structure;

a conductive trench contact structure laterally adjacent to the gate structure, the conductive trench contact structure including a trench insulating layer thereon;

an interlayer dielectric material above the gate structure and the conductive trench contact;

an opening in the interlayer dielectric material, the opening exposing the non-recessed conductive portion of the gate structure; and a conductive structure in the opening, the conductive structure in direct contact with the non-recessed conductive portion of the gate structure.

8. The integrated circuit structure of claim 7, wherein the opening further exposes a portion of the insulating layer.

9. The integrated circuit structure of claim 8, wherein the opening further exposes the trench insulating layer on the conductive trench contact structure.

10. The integrated circuit structure of claim 7, wherein the insulating layer and the trench insulating layer comprise a different material.

11. The integrated circuit structure of claim 10, wherein the trench insulating layer comprises silicon carbide, and the insulating layer comprise silicon nitride.

12. The integrated circuit structure of claim 7, further comprising:
a dielectric spacer laterally between the conductive trench contact structure and the gate structure.

13. A computing device, comprising:
a board; and
a component coupled to the board, the component including an integrated circuit structure, comprising:
a fin;
a gate structure over the fin, the gate structure including a recessed conductive portion and a non-recessed conductive portion;
an insulating layer on the recessed conductive portion of the gate structure and laterally adjacent to the non-recessed conductive portion of the gate structure, wherein the insulating layer has an uppermost surface at a same level as an uppermost surface of the non-recessed conductive portion of the gate structure;
a conductive trench contact structure laterally adjacent to the gate structure, the conductive trench contact structure including a trench insulating layer thereon;
an interlayer dielectric material above the gate structure and the conductive trench contact;
an opening in the interlayer dielectric material, the opening exposing the non-recessed conductive portion of the gate structure; and
a conductive structure in the opening, the conductive structure in direct contact with the non-recessed conductive portion of the gate structure.

14. The computing device of claim 13, further comprising:
a memory coupled to the board.

15. The computing device of claim 13, further comprising:
a communication chip coupled to the board.

16. The computing device of claim 13, wherein the component is a packaged integrated circuit die.

17. A computing device, comprising:
a board; and
a component coupled to the board, the component including an integrated circuit structure, comprising:
a three-dimensional body;
a gate structure completely surrounding a channel region of the three-dimensional body, the gate structure including a recessed conductive portion and a non-recessed conductive portion;
an insulating layer on the recessed conductive portion of the gate structure and laterally adjacent to the non-recessed conductive portion of the gate structure, wherein the insulating layer has an uppermost surface at a same level as an uppermost surface of the non-recessed conductive portion of the gate structure;
a conductive trench contact structure laterally adjacent to the gate structure, the conductive trench contact structure including a trench insulating layer thereon;
an interlayer dielectric material above the gate structure and the conductive trench contact;
an opening in the interlayer dielectric material, the opening exposing the non-recessed conductive portion of the gate structure; and
a conductive structure in the opening, the conductive structure in direct contact with the non-recessed conductive portion of the gate structure.

18. The computing device of claim 17, further comprising:
a memory coupled to the board.

19. The computing device of claim 17, further comprising:
a communication chip coupled to the board.

20. The computing device of claim 17, wherein the component is a packaged integrated circuit die.

* * * * *